s011362651B1

United States Patent
Krug et al.

(10) Patent No.: US 11,362,651 B1
(45) Date of Patent: Jun. 14, 2022

(54) PROTECTING A BODY DIODE OF A POWER SWITCH

(71) Applicant: Infineon Techologies AG, Neubiberg (DE)

(72) Inventors: Michael Krug, Munich (DE); Marco Bachhuber, Neuried (DE); Tommaso Bacigalupo, Fuerstenfeldbruck (DE); Benedikt Hanelt, Munich (DE); Marcus Nuebling, Olching-Esting (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/189,641

(22) Filed: Mar. 2, 2021

(51) Int. Cl.
*H03K 17/082* (2006.01)

(52) U.S. Cl.
CPC .............................. *H03K 17/0822* (2013.01)

(58) Field of Classification Search
CPC ..... H03K 17/0812–0828; H03K 17/082–0828
See application file for complete search history.

(56) References Cited

U.S. PATENT DOCUMENTS

| 9,634,657 | B1 | 4/2017 | Zoels et al. |
| 10,020,802 | B2 | 7/2018 | Zhao et al. |
| 10,367,407 | B2 | 7/2019 | Geske |
| 10,516,392 | B2 | 12/2019 | Sicard |
| 10,784,857 | B1 | 9/2020 | Li et al. |
| 2008/0007318 | A1 | 1/2008 | Pace et al. |
| 2013/0242438 | A1* | 9/2013 | Fukuta ................. H02H 1/0007 361/18 |
| 2019/0386654 | A1* | 12/2019 | Norling .................. H03K 17/18 |
| 2020/0021284 | A1 | 1/2020 | Thalheim |

FOREIGN PATENT DOCUMENTS

| EP | 1310045 A1 | 5/2003 |
| EP | 2887546 B1 * | 11/2018 ........... G01R 31/327 |
| WO | 2020207575 A1 | 10/2020 |

OTHER PUBLICATIONS

U.S. Appl. No. 17/189,607, filed Mar. 2, 2021, naming inventors Bacigalupo et al.

* cited by examiner

*Primary Examiner* — Jared Fureman
*Assistant Examiner* — Christopher J Clark
(74) *Attorney, Agent, or Firm* — Shumaker & Sieffert, P.A.

(57) ABSTRACT

This disclosure is directed to circuits and techniques for protecting a body diode of a power switch from an inductive load when the power switch is turned OFF. A driver circuit may detect whether the power switch is in a desaturation mode when the power switch is turned ON and disable the power switch in response to detecting that the power switch is in the desaturation mode. In addition, the driver circuit may detect whether the body diode of the power switch needs protection when the power switch is turned OFF, and in response to detecting that the body diode needs protection, control the power switch according to a body diode protection scheme.

24 Claims, 14 Drawing Sheets

PROTECTING A BODY DIODE OF A POWER SWITCH

TECHNICAL FIELD

This disclosure relates to power switches, and more specifically, techniques and circuits for protecting power switch circuits from different problems that can occur.

BACKGROUND

Power switches are used in a wide variety of applications in order to control power being delivered to a load. As examples, a power switch may comprise a Field Effect Transistor (FET), a bipolar junction transistor (BJT), a gallium nitride (GaN) switch, or a silicon carbide (SiC) switch, or possibly a silicon-controlled rectifier (SCR). Examples of FETs may include, but are not limited to, junction field-effect transistor (JFET), metal-oxide-semiconductor FET (MOSFET), dual-gate MOSFET, insulated-gate bipolar transistor (IGBT), any other type of FET, or any combination of the same. Examples of MOSFETS may include, but are not limited to, PMOS, NMOS, DMOS, or any other type of MOSFET, or any combination of the same. MOSFETs may be formed in silicon, gallium nitride, silicon carbide, or other materials. Examples of BJTs may include, but are not limited to, PNP, NPN, heterojunction, or any other type of BJT, or any combination of the same.

Power switches are typically controlled by a driver circuit via a modulation control signal, such as pulse width modulation (PWM), pulse frequency modulation (PFM), pulse duration modulation, pulse density modulation, or another type of modulation control signal. Modulation control signals can be applied to the gate of a power switch so as to control on/off switching of the power switch, and thereby control the average amount of power delivered through the power switch to a load. The on/off switching of the power switch effectively chops its power delivery up into discrete parts. The average value of voltage and/or current fed to a load can be controlled by turning the switch on and off at a fast rate. The longer the switch is on compared to the off periods, the higher the total power supplied to the load. In many applications, two different power switches are configured in a high-side and low-side configuration, and the on/off switching of the two power switches is synchronized in order to deliver the desired power to a switch node positioned between the high-side and low-side switch.

SUMMARY

In general, this disclosure describes circuits and techniques that are applied by a driver circuit in controlling a power switch. The circuits and techniques can provide protection against power switch malfunction, which may be desirable in a wide variety of circuit applications, especially in settings where safety is a concern. There are many different circuits and techniques described herein, and these different techniques may be related to specific solutions for protecting the power switch when the power switch is turned ON or for protecting the power switch when the power switch is turned OFF.

The techniques of this disclosure may leverage an already-existing detection pin associated with a driver circuit. The detection pin, for example, may comprise a so-called desaturation (DESAT) pin, or possibly an overcurrent protection (OCP) pin. The circuits and techniques of this disclosure may use the detection pin for DESAT or OCP monitoring and protection, and the techniques may also use the detection pin for additional diagnosis or detection purposes associated with the power switch. For example, according to this disclosure, the detection pin may be used to monitor a safe operating area (SOA) limit of the power switch when the switch is operating in an ON state. In this case, the driver circuit may detect whether the power switch is trending towards an SOA limit of the power switch based on a rate of change of a signal on the detection pin. In doing so, the driver circuit may be configured to disable the power switch in response to detecting that the power switch is trending towards the SOA limit, which may help protect the power switch from malfunction.

In other examples, a driver circuit may use the detection pin to monitor whether a body diode needs protection when the power switch is turned OFF. Such body diode protection of the power switch may be desirable to protect the switch from damage that can occur due to current or voltage passing to the switch from an inductive load when the power switch is turned OFF. Accordingly, in this case, the detection pin may be used by the driver circuit to monitor whether body diode of the power switch needs protection, and if so, the driver circuit may control the power switch in a way that can protect the body diode.

In one example, this disclosure describes a driver circuit configured to control a power switch. The driver circuit may comprise an output pin, wherein the driver circuit is configured to deliver drive signals from the output pin to the power switch to control ON/OFF switching of the power switch. The driver circuit may also comprise a detection pin configured to receive a signal associated with the power switch, wherein the detection pin comprises a DESAT detection pin or an OCP pin. In addition, the driver circuit may comprise protection logic connected to the detection pin, wherein the protection logic is configured to: detect whether the power switch is in a desaturation mode or an overcurrent state based on the signal; disable the power switch in response to detecting that the power switch is in the desaturation mode or the overcurrent state; detect whether the power switch is trending towards an SOA limit of the power switch based on a rate of change of the signal; and disable the power switch in response to detecting that the power switch is trending towards the SOA limit.

In another example, this disclosure describes a method of controlling a power switch. The method may comprise delivering drive signals from an output pin to the power switch to control ON/OFF switching of the power switch; receiving a signal associated with the power switch via a detection pin, wherein the detection pin comprises a DESAT detection pin or an OCP pin; detecting whether the power switch is in a desaturation mode or an overcurrent state based on the signal; disabling the power switch in response to detecting that the power switch is in the desaturation mode or the overcurrent state; detecting whether the power switch is trending towards an SOA limit of the power switch; and disabling the power switch in response to detecting that the power switch is trending towards the SOA limit.

In another example, this disclosure describes a system comprising: a power switch that includes a transistor; and a driver circuit configured to control the power switch. The driver circuit may comprise an output pin, wherein the driver circuit is configured to deliver drive signals from the output pin to the power switch to control ON/OFF switching of the power switch, and a detection pin configured to receive a signal associated with the power switch, wherein the detection pin comprises a DESAT detection pin or an OCP pin. The driver circuit may also comprise protection logic connected to the detection pin, wherein the protection logic is configured to: detect whether the power switch is in a desaturation mode or an overcurrent state based on the signal; disable the power switch in response to detecting that the power switch is in the desaturation mode or the overcurrent state; detect whether the power switch is trending towards an SOA limit of the power switch based on a rate of change of the signal; and disable the power switch in response to detecting that the power switch is trending towards the SOA limit.

In another example, this disclosure describes a driver circuit configured to control a power switch that includes a body diode. In this example, the driver circuit comprises an output pin, wherein the driver circuit is configured to deliver drive signals from the output pin to the power switch to control ON/OFF switching of the power switch, and a detection pin configured to receive a signal associated with the power switch, wherein the detection pin comprises a DESAT detection pin. The driver circuit may also comprise protection logic connected to the detection pin, wherein the protection logic is configured to: detect whether the power switch is in a desaturation mode when the power switch is turned ON; disable the power switch in response to detecting that the power switch is in the desaturation mode; detect whether the body diode of the power switch needs protection when the power switch is turned OFF; and in response to detecting that the body diode needs protection, control the power switch according to a body diode protection scheme.

In another example, this disclosure describes a method of controlling a power switch that includes a body diode. The method may comprise delivering drive signals from output pin of a driver circuit to the power switch to control ON/OFF switching of the power switch; receiving a signal associated with the power switch via a detection pin of the driver circuit, wherein the detection pin comprises a desaturation (DESAT) detection pin; detecting whether the power switch is in a desaturation mode when the power switch is turned ON; disabling the power switch in response to detecting that the power switch is in the desaturation mode; detecting whether the body diode of the power switch needs protection when the power switch is turned OFF; and in response to detecting that the body diode needs protection, control the power switch according to a body diode protection scheme.

In another example, this disclosure describes a system comprising: a power switch that includes a transistor; and a driver circuit configured to control the power switch. The driver circuit may comprise an output pin, wherein the driver circuit is configured to deliver drive signals from the output pin to the power switch to control ON/OFF switching of the power switch, and a detection pin configured to receive a signal associated with the power switch, wherein the detection pin comprises a DESAT detection pin. The driver circuit may also comprise protection logic connected to the detection pin, wherein the protection logic is configured to: detect whether the power switch is in a desaturation mode or when the power switch is turned ON; disable the power switch in response to detecting that the power switch is in the desaturation mode; detect whether the body diode of the power switch needs protection when the power switch is turned OFF; and in response to detecting that the body diode needs protection, turn the power switch ON and OFF according to a body diode protection scheme.

Details of these and other examples are set forth in the accompanying drawings and the description below. Other features, objects, and advantages will be apparent from the description and drawings, and from the claims.

DETAILED DESCRIPTION

This disclosure describes circuits and techniques that are applied by a driver circuit in controlling a power switch. The circuits and techniques can provide protection against power switch malfunction, which may be desirable in a wide variety of circuit applications, especially in settings where safety is a concern. There are many different circuits and techniques described herein, and these different techniques may be related to specific solutions for protecting the power switch when the power switch is turned ON or for protecting the power switch when the power switch is turned OFF.

The techniques of this disclosure may leverage an already-existing detection pin associated with a driver circuit. The detection pin, for example, may comprise a so-called desaturation (DESAT) pin, or possibly an overcurrent protection (OCP) pin. DESAT pins may be used to monitor whether a power switch is operating in a desaturation mode, which is undesirable. If a power switch is operating in the desaturation mode, as determined by a signal on the DESAT pin, the power switch may be disabled. OCP pins are also used for power switch monitoring and protection, and in this case, if the power switch is operating in an overcurrent state, as determined by a signal on the OCP pin, the power switch may be disabled.

The techniques and circuits of this disclosure may use a signal on the already-existing detection pin for additional diagnosis or detection purposes associated with the power switch (e.g., in addition to DESAT detection or OCP). For example, according to this disclosure, the detection pin may be used to monitor a safe operating area (SOA) limit of the power switch when the switch is operating in an ON state. In this case, the driver circuit may detect whether the power switch is trending towards an SOA limit of the power switch based on a rate of change of a signal on the detection pin. In doing so, the driver circuit may be configured to disable the power switch in response to detecting that the power switch is trending towards the SOA limit, which may help protect the power switch from malfunction. In some examples, the SOA limit may be defined as a set of current and voltage conditions under which the power switch can be expected to operate without self-damage.

In other examples, a driver circuit may use the detection pin to monitor whether a body diode needs protection when the power switch is turned OFF. Such body diode protection of the power switch may be desirable to protect the switch from damage that can occur from current and/or voltage passing to the switch from an inductive load when the power switch is turned OFF. Accordingly, in such examples, the detection pin may be used by the driver circuit to monitor whether body diode of the power switch needs protection, and if so, the driver circuit may control the power switch in a way that can protect the body diode of the power switch so as to help avoid malfunction of the power switch.

Figure 1:
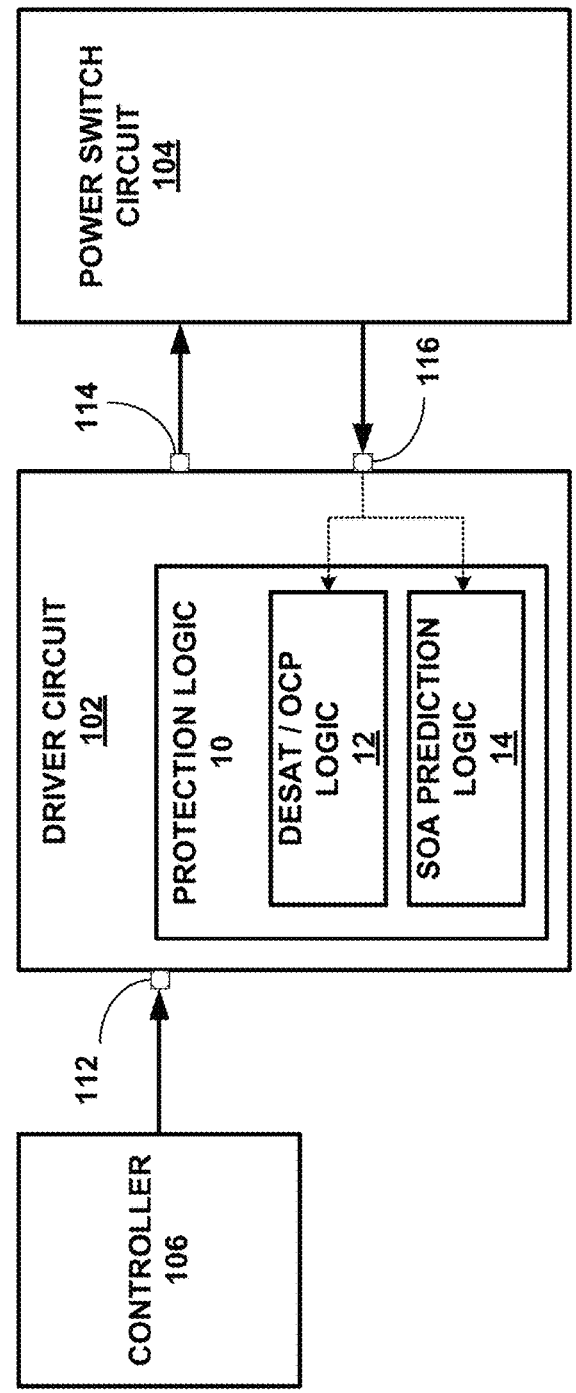
FIG. 1 is a block diagram of an example system that includes a power switch circuit, a driver circuit, and a controller.

FIG. 1 is a block diagram of an example system 100 that includes a power switch circuit 104, a driver circuit 102, and a controller 106. Controller 106 may comprise a microprocessor configured to control driver circuit 102. In particular, controller 106 sends command signals to driver circuit 102 via input pin 112. Based on these command signals, driver circuit 102 sends ON/OFF signals (e.g., gate control signals) to power switch circuit 104 to turn the power switch ON or OFF.

Driver circuit 102 may control power switch circuit 104 via modulation signals on output pin 114, which may control the ON/OFF switching of a transistor within power switch circuit 104. The modulation signals, for example, may comprise pulse width modulation (PWM) signals, pulse frequency modulation (PFM) signals, pulse duration modulation signals, pulse density modulation signal, or another type of modulation control signal use to control a power transistor. In normal operation, the signals from driver circuit 102 over output pin 114 can be applied to the gate (or other control terminal) of a power switch within power switch circuit 104 so as to control on/off switching of the power switch, and thereby control the average amount of power delivered through the power switch to a load (not shown in FIG. 1). In the most general sense, driver circuit 102 may comprise any type of driver for any type of power switch, e.g., a high-side switch driver, a low-side switch driver, a driver within a flyback power converter, or any driver used in any circuit arrangement that controls ON/OFF switching of one or more power switches.

Power switch circuit 104 may comprise a power transistor. In the example of FIG. 1, the power transistor within power switch circuit 104 may comprise an insulated gate bipolar transistor (IGBT), or a MOSFET. The MOSFET may be formed in silicon, in which case the MOSFET may be called a silicon MOSFET. Alternatively, the MOSFET may be formed in another semiconductor material, such as silicon carbide (SiC) or gallium nitride (GaN), in which case the MOSFET may be called a SiC MOSFET or a GaN MOSFET.

According to this disclosure, driver circuit 102 includes protection logic 10 connected to a detection pin 116. Detection pin 116 may comprise a so-called DESAT pin or an OCP pin. DESAT/OCP logic 12 refers to logic that is configured to determine whether a power switch within power switch circuit 104 is operating in a desaturation mode or an overcurrent state (e.g., typically one or the other). DESAT/OCP logic 12 may be configured to disable the power switch in response to detecting that the power switch within power switch circuit 104 is operating in the desaturation mode or in the overcurrent state. In the example of desaturation, in order to detect whether the power switch is in the desaturation mode, logic 12 may be configured to compare a signal magnitude of the signal on detection pin 116 to a desaturation threshold when the power switch is ON. The signal detected on detection pin 116, for example, may comprise a measure of the voltage drop across the power switch within power switch circuit 104. In some cases, this voltage drop across the power switch within power switch circuit 104 may be referred to as a "Vce" voltage, which typically indicates a voltage between a collector and an emitter of an IGBT.

According to this disclosure, in addition to checking on DESAT or OCP, one or more addition checks may be performed by protection logic 10 based on the signal or signals received at detection pin 116. In particular, protection logic 10 includes SOA prediction logic 14. SOA prediction logic 14 may be configured to detect whether the power switch is trending towards an SOA limit of the power switch based on a rate of change of the signal on detection pin 116. Moreover, SOA prediction logic 14 may be configured to disable the power switch within power switch circuitry 104 in response to detecting that the power switch is trending towards the SOA limit. The rate of change of the signal on detection pin 116, for example, may be compared to an expected rate. If the rate is too high, this may indicate a trend towards an SOA limit that may cause damage. Therefore, if the rate of change of the signal on detection pin 116 is too high, then SOA prediction logic 14 may be configured to disable the power switch within power switch circuitry 104. The expected rate may be pre-defined within SOA prediction logic 14 for a given type of power switch circuit. The expected rate could also be a programmable parameter that can be set by a user/customer by changing the parameter in a non-volatile memory. By disabling the power switch in response to the rate of change of the signal on detection pin 116 being too high, the techniques may help to avoid a subsequent switching cycle that could likely damage the power switch.

In some examples, to detect whether the power switch is trending towards the SOA limit, the SOA prediction logic 14 may be configured to determine the rate of change of the signal based on two or more measurements of an accumulation of the signal. The signal on detection pin 116 may indicate a voltage drop across the power switch and the two or more measurements of the accumulation of the signal can be used to define a slope of the accumulation over a period of time that is indicative of the rate of change of the signal. In other words, two or more measurements and the time between such measurements may be used to define the slope defining the rate of change of the signal on detection pin 116.

The SOA limit of the power switch may be temperature dependent. Accordingly, in some cases, SOA prediction logic 14 may be configured to detect whether the power switch is trending towards the SOA limit of the power switch based on the rate of change of the signal on detection pin 116 and based on a temperature associated with the power switch. In this case, the temperature of the power switch may be measured internally or locally, or possibly inferred based on one or more parameters or measurements. Different rates of change of the signal on detection pin 116 may be acceptable or unacceptable, for example, depending on the temperature at which the power switch is operating.

In some cases, upon turning a power switch ON, SOA prediction logic 14 may be configured to wait until after a brief "blanking" period before performing measurements or determinations. For example, the brief "blanking" period may refer to a period of time needed for the power switch to reach a steady state. During transitions from ON or OFF states, the power transistor may experience brief voltage or current spikes, but these are short duration spikes that do not typically cause problems. Accordingly, in order to achieve desirable determinations, the rate of change of the signal on detection pin 116 may be determined by SOA prediction logic 14 over a period of time, wherein upon turning the power switch ON, the period of time begins after a blanking period or after current through the power switch reaches a current threshold. In this way, by delaying the accumulation measurements until after the blanking period or until after current through the power switch has reached a current threshold, more desirable measurements and determinations can be made by SOA prediction logic 14.

In some examples, the rate of change of the signal on detection pin 116 may be indicative of a slew rate associated with the power switch. In some examples, SOA prediction logic 14 may be configured to determine the slew rate based on an amount of time between an accumulation of the signal reaching a first threshold and the accumulation of the signal reaching a second threshold. As with other example, upon turning the power switch ON, the amount of time may be defined after waiting a blanking period (e.g., a pre-defined period of time) or after current through the power switch has reached a current threshold (e.g., a period of time corresponding to the amount of time that it takes for current through the power switch to reach a pre-defined current threshold after turn ON).

Power switches, especially IGBT and SiC power modules can be used to switch currents in the range of several hundred amperes. Protection of such modules may include:
  a) DESAT—desaturation protection. DESAT may refer to the monitoring of Vce across IGBT/SiC power module. If voltage gets too large as current gets too large the power module is switched off
  b) OCP—over current protection. OCP may refer to the monitoring of voltage on a dedicated power module pin. Some power modules provide a scaled down current information on dedicated OCP pin These protections may have defined thresholds, which are sometimes programmable on power up. In some cases, whenever the threshold is reached, a turn OFF of the power module is initiated. In this way destructive currents can be detected and prevented in the power switch.

Even with DESAT or OCP protection, however, there can be problems in the operation of power switches. Damage to the power switch can occur even below such destructive currents or thresholds examined by DESAT or OCP monitoring, such as if the power switch is operated in high current situations for a long period of time. For example, if a power switch is switched into a highly inductive short circuit, there can be a situation where current rises steadily, but does not reach the over current or desaturation protection thresholds. In this case, the next switch OFF may cause high voltages (due to inductance) in conjunction with (still) high currents. This undesirable situation can lead to SOA/RBSOA violations that can degrade or destroy the power switch. RBSOA refers to "reverse bias safe operating area." In some cases, power modules are "overbuilt" to help ensure that worst-case SOA/RBSOA violations can be handled by the power switch, but this increases the cost of power switch production.

In some examples, the techniques of this disclosure may allow for the use of less expensive (lower quality) power switches in one or more settings where power switches were previously overbuilt, e.g., by ensuring that SOA/RBSOA violations are predicted in advance and avoided. This can also help to improve yield in circuit fabrication by lowering the quality threshold needed for a given batch of power switches in circuit the fabrication process. Rather than overbuilding power switches to handle worst-case scenarios, the techniques of this disclosure may help predict and avoid such worst-case scenarios by monitoring and protecting the SOA of the power module in our IGBT/SiC gate drivers. And by performing such monitoring and protection via an already existing pin (e.g., DESAT or OCP) cost can be reduced in an implementation that is highly compatible to existing systems.

Figure 2:
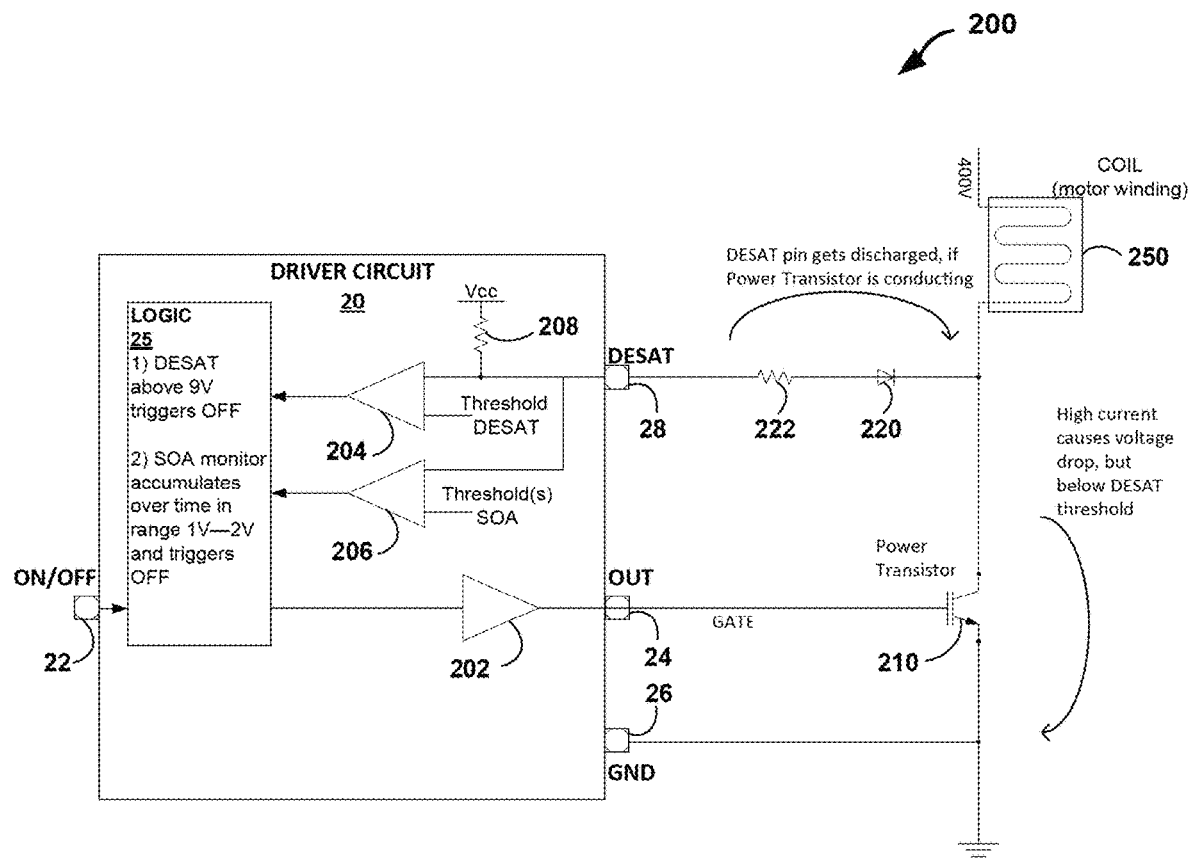
FIG. 2 is a block diagram of an example gate driver circuit controlling a power transistor that is connected to an inductive load.

FIG. 2 is a block diagram of an example driver circuit 20 controlling a power transistor 210 that is connected to an inductive load 250, which may comprise a motor winding or other electrical coil that forms an inductor. In this example, power transistor 210 may comprise an IGBT. In other examples, however, power transistor 210 may comprise a MOSFET, which includes a body diode (not shown in FIG. 2). In the case of a MOSFET, a body diode, for example, may comprise a parasitic PN junction that is formed in fabricating the MOSFET. In either case, driver 20 may receive ON/OFF command signals via input pin 22, which may be connected to a microprocessor. Based on these ON/OFF command signals, driver circuit 20 sends ON/OFF signals to the gate of power transistor 210 via output pin 24. One or more amplifiers 202 may generate the gate driving signals based on the ON/OFF command signals received at input pin 22. The gate driving signals, for example, may comprise PWM signals, PFM signals, pulse duration modulation signals, pulse density modulation signal, or another type of modulation control signal use to control power transistor 210. In normal operation, the signals from driver circuit 20 over output pin 24 are applied to the gate (or other control terminal) of power transistor 210 so as to control on/off switching of power transistor 210, and thereby control the average amount of power delivered through the power switch to load 250. A ground pin 26 is also illustrated in FIG. 2.

According to this disclosure, driver circuit 20 includes logic 25 that is connected to a DESAT pin 28. Although illustrated separately, logic 25 may include comparators 204 and 206, as well as resistor 208 between a reference Vcc voltage and DESAT pin 28. Externally to driver circuit 20, DESAT pin 28 may be connected to resistor 222. Resistor 222 is connected to diode 220, and diode 220 is connected to the load current path between load 250 and power transistor 210. Put another way, resistor 222 and diode 220 are positioned between DESAT pin 28 and a node located between power transistor 210 and inductive load 250. This arrangement allows driver circuit 20 to use DESAT pin 28 and external diode 220 to monitor a voltage across power transistor 210, which in the case of an IGBT may comprise a collector-emitter voltage (e.g., "Vce").

External diode 220 may comprise a voltage decoupling device for driver circuit 20. In particular, external diode 220 decouples the high voltage domain associated with the load current path of power transistor 210 from the low voltage domain of driver circuit 20. Driver circuit 20, for example may operate at less than 50 or 60 volts, whereas the load current path of power transistor 210 may be capable of withstanding voltages above 1000 volts.

When power transistor 210 is turned ON, driver circuit 20 may be configured to disable power transistor 210 in response to detecting that power transistor 210 is operating in a desaturation mode. For example, comparator 204 may be configured to compare a signal magnitude of the signal on DESAT pin 28 to a desaturation threshold when the power switch is ON. Again, the signal detected on DESAT pin 28 may comprise a measure of the voltage drop across power transistor 210. If the signal detected on DESAT pin 28 exceeds the DESAT threshold, then logic 25 may cause driver circuit 20 to send output signals over output pin 24 that disable power transistor 210. As one non-limiting example, the DESAT threshold may be approximately 9 volts, although different transistors may define higher or lower DESAT thresholds.

According to this disclosure, in addition to checking on desaturation of power transistor 210, driver circuit 20 may be further configured to perform one or more addition checks based on the signal or signals received at DESAT pin 28. In particular, driver circuit 20 includes an additional comparator 206 and additional logic within logic 25 that are configured to detect whether the power transistor 210 is trending towards an SOA limit based on a rate of change of the signal on DESAT pin 28. Although illustrated separately, comparator 206 may be considered part of logic 25 within driver circuit 20.

Driver circuit 20 may be configured to disable power transistor 210 in response to detecting that power transistor is trending towards its SOA limit. For example, driver circuit 20 may be configured to detect a rate of change of the signal on DESAT pin 28, and this rate of change may be compared to an expected rate. If the rate is too high, this may indicate a trend towards an SOA limit that may cause damage, such as in a future switching cycle. Therefore, if the rate of change of the signal DESAT pin 28 is too high, then driver circuit 20 may be configured to disable power transistor 210. The expected rate may be pre-defined within logic 25 for a given type of power switch circuit. The expected rate could also be a programmable parameter that can be set by a user/customer by changing the parameter in a non-volatile memory. Logic 25 may monitor an accumulation over time, e.g., in the range of 1-2 volts, in order to determine the rate of change of voltage on DESAT pin 28. Comparator 206 may be programmed with one or more SOA thresholds in order to determine this rate of change, which may define a slew rate of power transistor 210. SOA logic 20 may include a counter in order to measure the voltage accumulation (e.g., the change in voltage) over time, or to measure the amount of time that it take for voltage to accumulate to a particular level (such as two volts), or to measure the amount of time that it takes for voltage to accumulate from one level (such as one volt) to another level (such as two volts). In other examples, to detect whether power transistor 210 is trending towards the SOA limit, logic 25 may be configured to determine the rate of change of the signal on DESAT pin 28 based on two or more measurements of an accumulation of the signal over time (e.g., two measurements of voltage on DESAT pin 28 and an amount of time between such measurements). In these and other ways, driver circuit 20 can measure the rate of change of the signal on DESAT pin 28. In any case, if logic 25 determines that the rate of change of the signal on DESAT pin 28 exceeds an acceptable rate of change, then driver circuit 20 may send signals via output pin 24 to disable power transistor 210, which may protect power transistor 210 from ever reaching the limits of its SOA.

Figure 3:
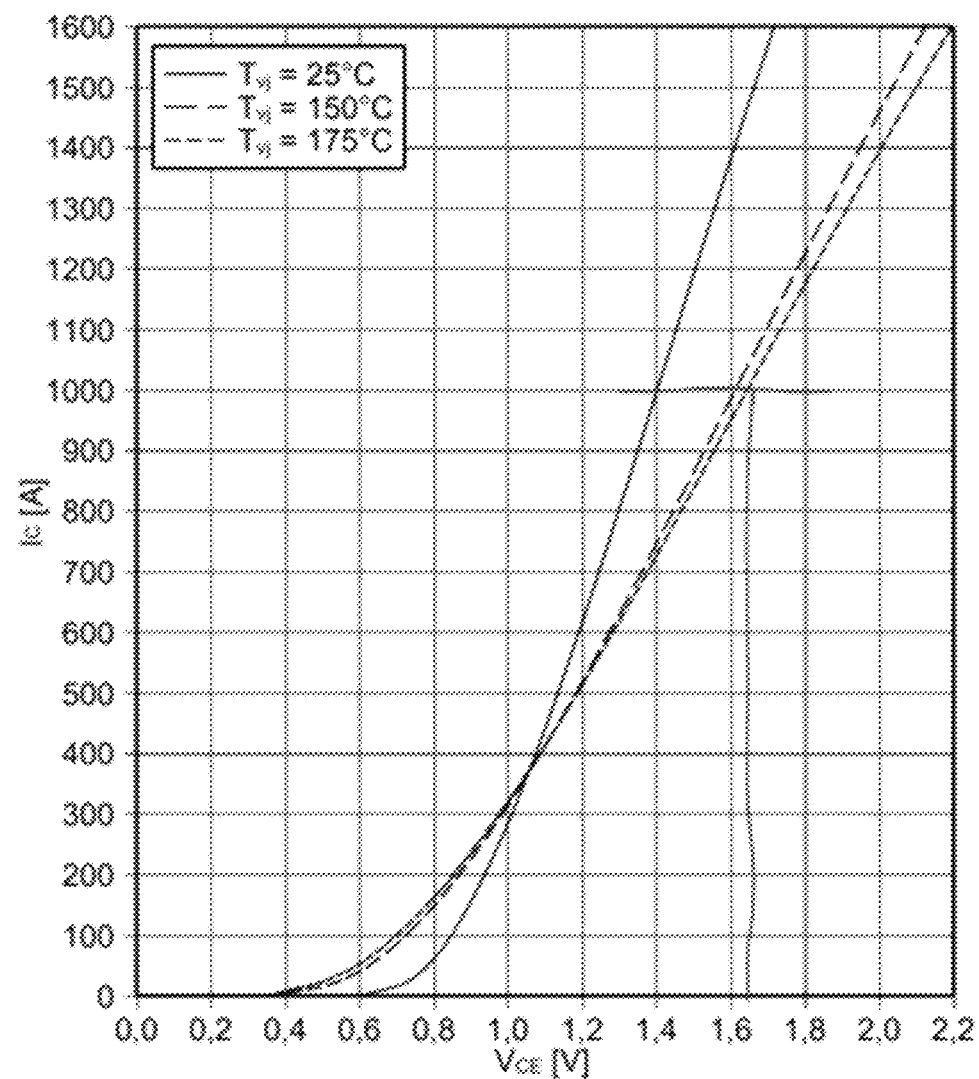
FIG. 3 is a graph illustrating a general phenomenon whereby the output characteristic of an IGBT is dependent upon temperature, which the techniques of this disclosure may address.

In some cases, the SOA limit of the power switch may be temperature dependent. FIG. 3 is a graph illustrating a general phenomenon whereby the output characteristic of an IGBT is dependent upon temperature. As can be seen in FIG. 3, Vce maps to a collector current, but this mapping follows a transfer curve of an IGBT that is different at different temperatures. At 1.6 Volts, for example, the transfer curve of the IGBT defines 1000 Amps at 170 Centigrade, but at 1.6 Volts, the transfer curve of the IGBT defines approximately 1500 Amps at 25 Centigrade. In some examples, the techniques of this disclosure may recognize and account for the temperature-dependent operation of power transistor 210. In other words, different rates of change of the signal detected on DESAT pin 28 may be acceptable or unacceptable, depending upon the temperature associated with power transistor 210. Accordingly, in some cases, logic 25 may be configured to detect whether the power switch is trending towards the SOA limit of the power switch based on the rate of change of the signal on DESAT pin 28 and based on a temperature associated with power transistor 210. In this case, the temperature associated with power transistor 210 may be measured internally or locally, or possibly inferred based on one or more parameters or measurements.

In some cases, upon turning a power switch ON, for SOA monitoring, logic 25 may be configured to wait until after a brief "blanking" period or a period of time until current through the power switch reaches a current threshold before performing measurements or determinations on the rate of change of the signal on DESAT pin 28. For example, the brief "blanking" period may refer to a period of time needed for the power switch to reach a steady state, which may be defined by a pre-defined period of time or by an amount of time that it takes for the power transistor 210 to reach a pre-defined level of current flow. During transitions from ON or OFF states, power transistor 210 may experience brief voltage or current spikes, but these are short duration spikes that do not typically cause problems. Accordingly, in order to achieve desirable and determinations, the rate of change of the signal on DESAT pin 28 may be determined by logic 25 over a period of time, wherein upon turning the power switch ON, the period of time begins after a blanking period or after current through power transistor 210 has reached a current threshold. In this way, by delaying the accumulation measurements until after the blanking period or after current through power transistor 210 has reached a current threshold, more desirable measurements and determinations can be made by logic 25.

In some examples, the rate of change of the signal on DESAT pin 28 may be indicative of a slew rate associated with the power switch. In some examples, logic 25 may be configured to determine the slew rate based on an amount of time between an accumulation of the signal reaching a first threshold and the accumulation of the signal reaching a second threshold. As with other example, upon turning the power switch ON, the amount of time may be defined after waiting a blanking period or after current through the power transistor 210 reaches a current threshold.

More generally, temperature dependency of the SOA measurements can be compensated in a number of different ways. In some cases, temperature dependence can be addressed by measuring the initial DESAT voltage on DESAT pin 28 when power transistor 210 switches on and using this initial temperature as reference point. In some cases, temperature dependence can be addressed by adjusting thresholds according to one or more temperature elements (e.g., temperature dependent diodes or temperature dependent resistors) within a power module. The gate voltage of the power module can also be taken into account for adjusting its limit, as the voltage drop over a power transistor for a defined level of current may scale as a function of the supplied gate voltage.

Figure 4:
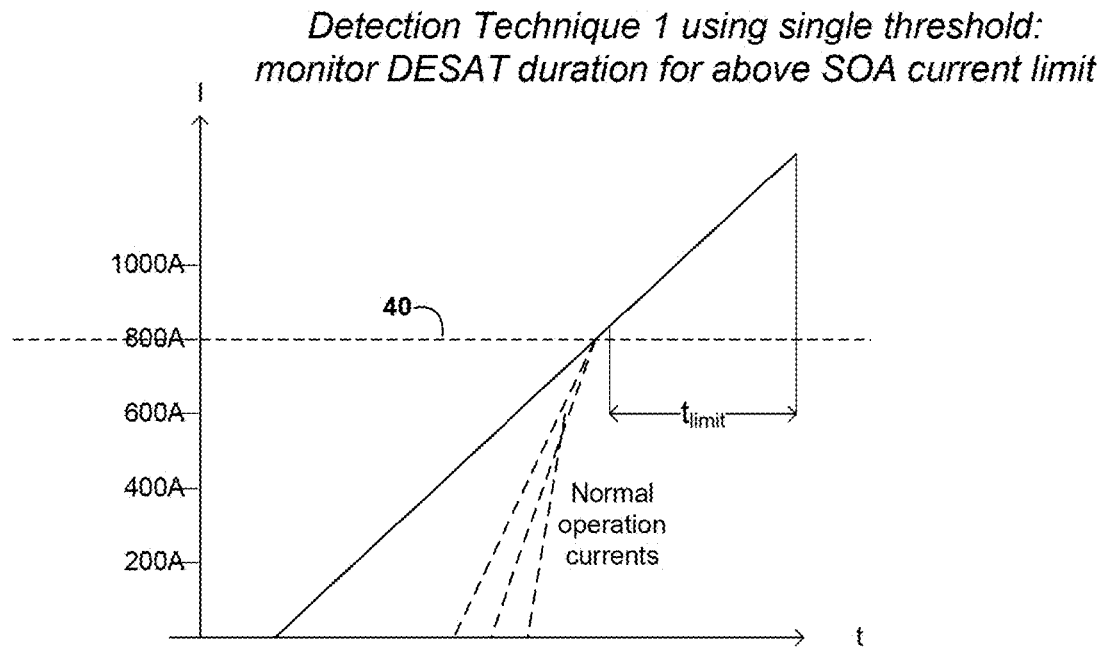
FIG. 4 is a timing diagram demonstrating a rate of change detection technique that can be performed on a detection pin of driver circuit.

FIG. 4 is a timing diagram demonstrating a rate of change detection technique that can be performed on a detection pin of driver circuit. In this example, a threshold 40 may comprise an Amp threshold for current through the power switch, and threshold 40 can be stored in driver logic. The logic may be configured to measure the duration of the DESAT voltage signal above threshold 40. In the example of FIG. 4, threshold 40 may correspond to 800 Amps, although other values could be defined for various power switches. With the example of FIG. 4, power switch may be disabled if the ON time above the current threshold 40 exceeds $t_{limit}$.

Figure 5:
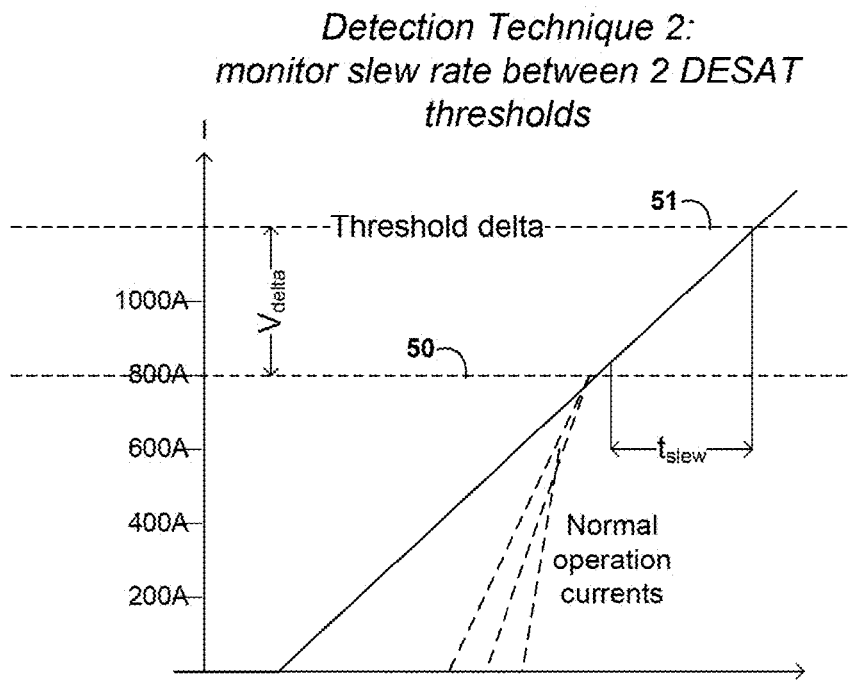
FIG. 5 is another timing diagram demonstrating another rate of change detection technique that can be performed on a detection pin of driver circuit.

FIG. 5 is another timing diagram demonstrating another rate of change detection technique on a detection pin of driver circuit. In this example, driver logic of a driver circuit may measure the time between the voltage on a detection pin reaching a first threshold 50 and reaching a second threshold 51. With two voltage measurements, and a time between such measurements, the logic can determine the slew rate (Tslew). In some cases, second threshold 51 may comprise a delta voltage (e.g., a change) relative to first threshold 50. In some cases (as shown in FIG. 5), the first threshold may be defined as current level (e.g., 800 Amps, which in turn defines the window of time that it takes for the power switch to reach 800 Amps of current flow). In other examples, however, the first threshold could be defined as a pre-defined blanking period (e.g., a time period), in which case, the level of current after that pre-defined blanking period could establish the first measurement for determining Tslew.

Figure 6A:
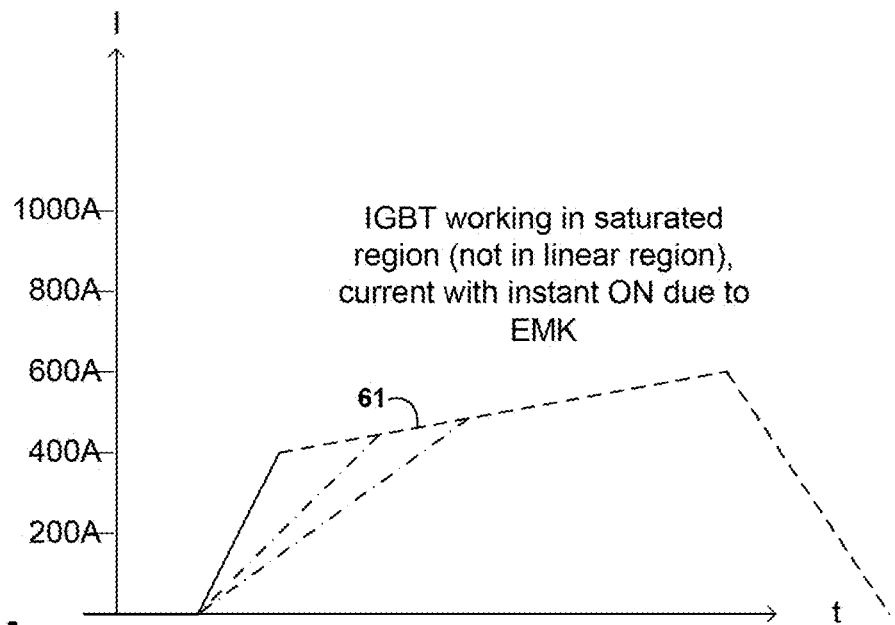
FIGS. 6A and 6B are graphical depictions of current and voltage during normal operation of an IGBT.
Figure 6B:
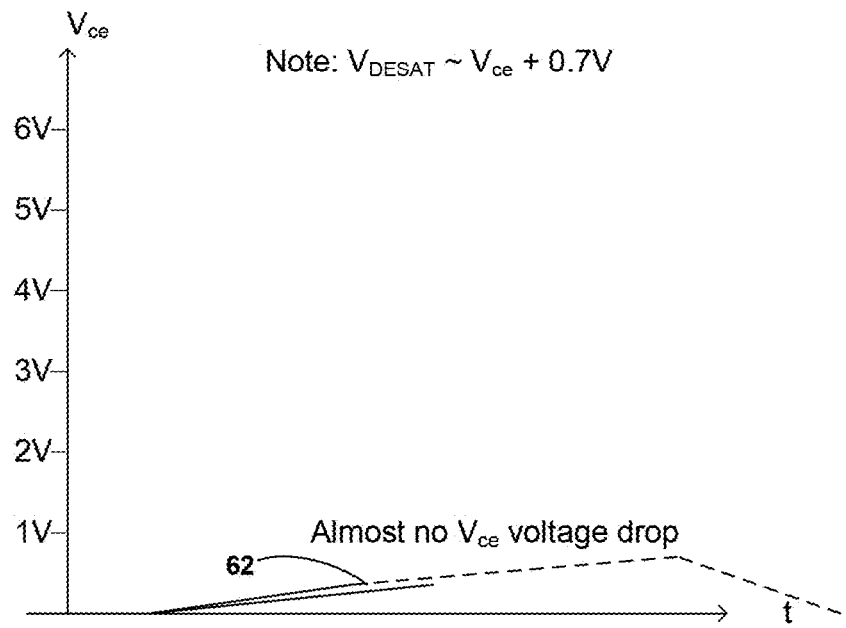

FIGS. 6A and 6B are graphical depictions of current and voltage during normal operation of an IGBT. As shown in FIG. 6A, curves 61 shows the current level of the IGBT working in a saturated region (not a linear region). As shown in FIG. 6B, curve 62 shows a voltage drop across the IGBT (Vce) during such normal operation.

Figure 7A:
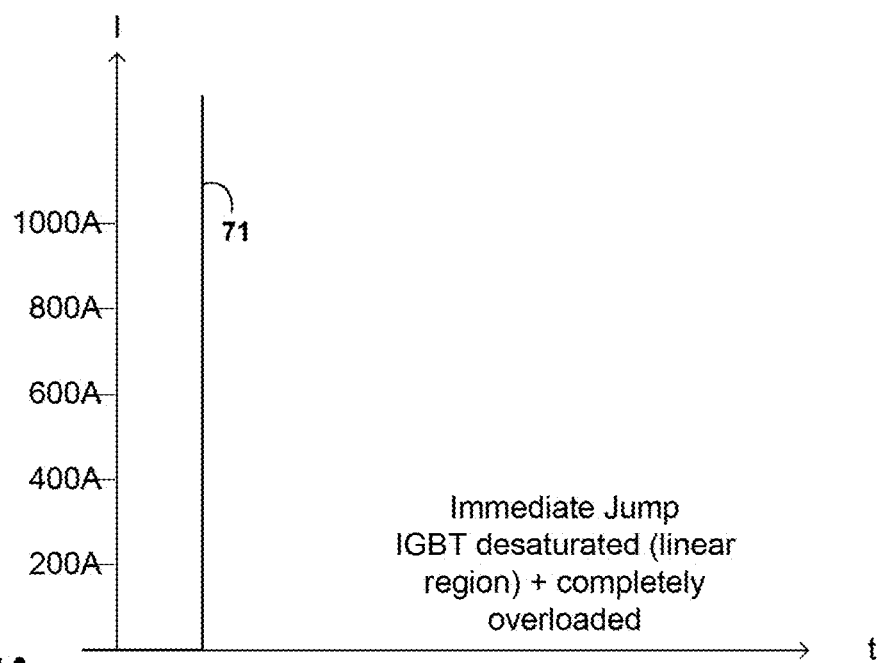
FIGS. 7A and 7B are graphical depictions of current and voltage during operation of an IGBT in the presence of a resistive short circuit.
Figure 7B:
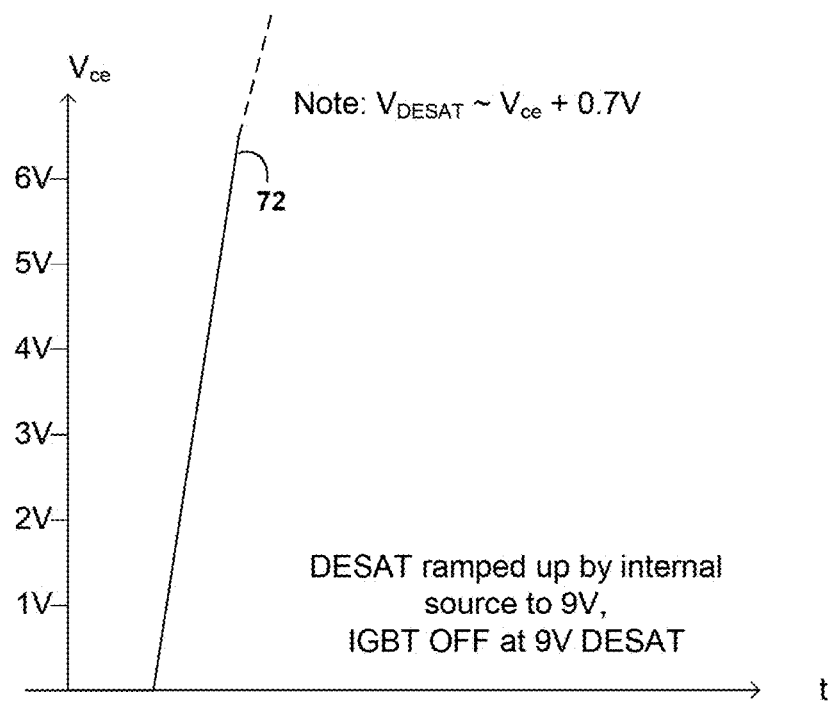

FIGS. 7A and 7B are graphical depictions of current and voltage during operation of an IGBT in the presence of a resistive short circuit. Accordingly, FIGS. 7A and 7B demonstrate operation of DESAT monitoring consistent with this disclosure. As shown in FIG. 7A, curve 71 shows the current level of the IGBT with an immediate jump because the IGBT is working in a desaturated (linear) region and is completely overloaded. As shown in FIG. 7B, curve 72 shows a voltage drop across the IGBT (Vce) during operation with a resistive short circuit. In this case, the DESAT voltage ramps up quickly. Upon reaching a DESAT threshold under these conditions (e.g., 9 Volts), the power switch may be disabled to avoid damage/destruction of the power switch.

Figure 8A:
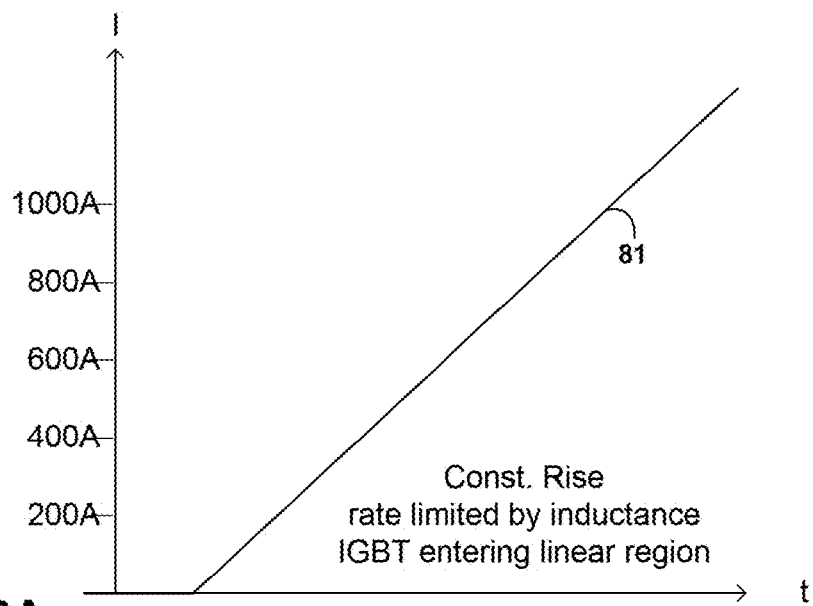
FIGS. 8A and 8B are graphical depictions of current and voltage during operation of an IGBT in the presence of an inductive short circuit, which could result in SOA violations over time.
Figure 8B:
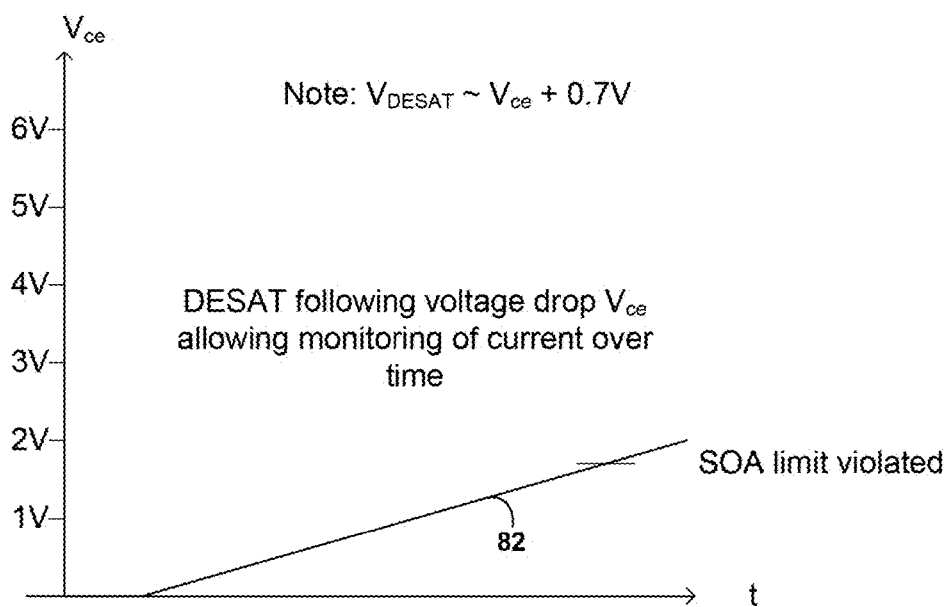

FIGS. 8A and 8B are graphical depictions of current and voltage during operation of an IGBT in the presence of an inductive short circuit (e.g., an inductive short in the load), which could result in SOA violations over time. Accordingly, FIGS. 8A and 8B demonstrate operation of SOA monitoring which may be combined with DESAT monitoring (such as that described herein and shown in FIGS. 7A and 7B). As shown in FIG. 8A, curve 81 shows the current level of the IGBT with a constant rise in the current rate limited by inductance. In this case, the IGBT may be entering its linear region of operation. As shown in FIG. 8B, curve 82 shows a voltage drop across the IGBT (Vce) during operation in the presence of an inductive short circuit. In this case, the DESAT voltage rises with a linear rate of change over time. Upon identifying an SOA limit violation, the power switch may be disabled to avoid damage/destruction of the power switch. Again, as described herein, the SOA limit may be defined and determined based on a rate of change of voltage level on the DESAT pin (or other detection pin). The rate of change can be determined in a variety of ways, as set forth above.

Figure 9:
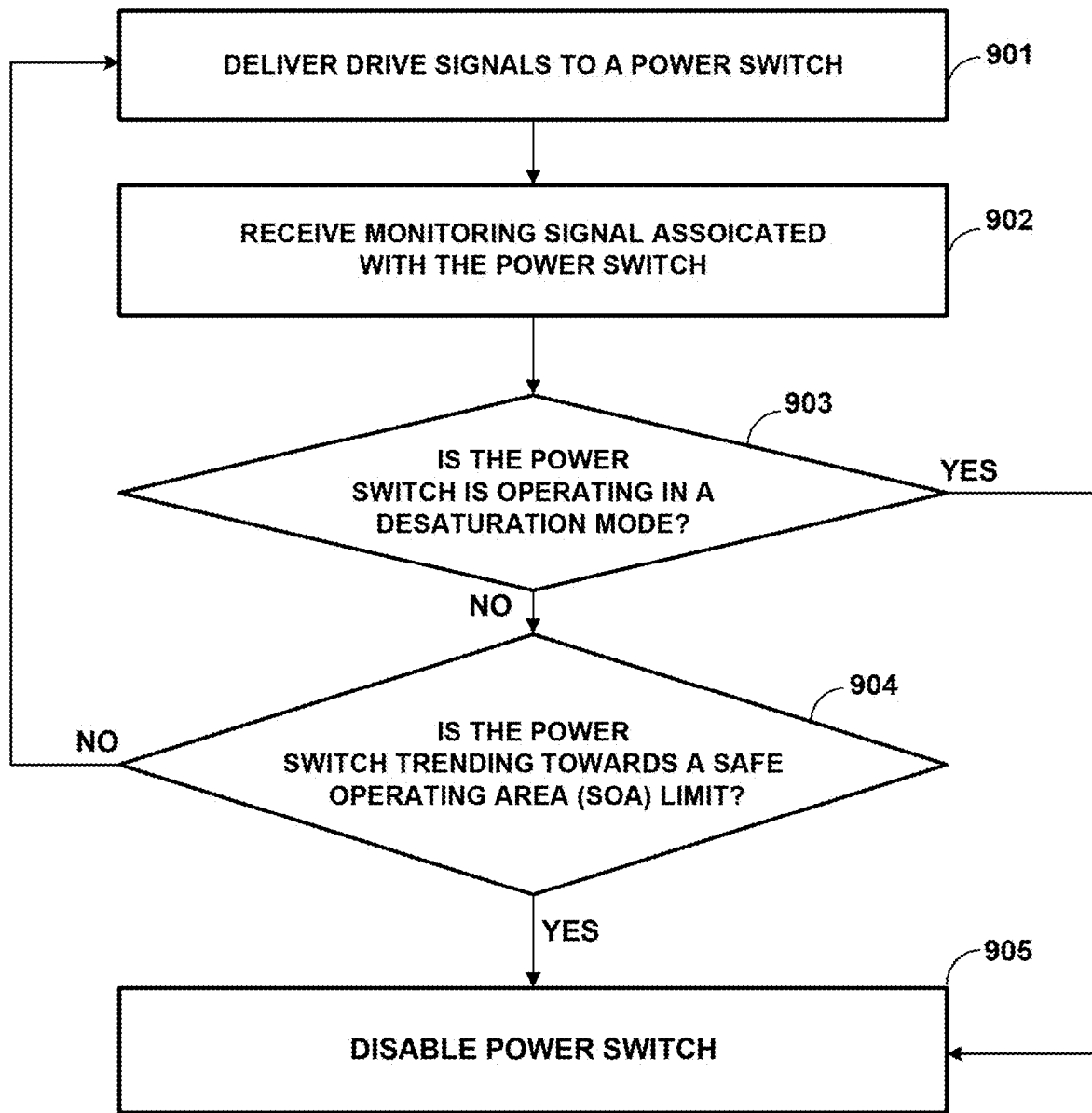
FIG. 9 is a flow diagram illustrating a method of controlling a power switch.

FIG. 9 is a flow diagram illustrating a method of controlling a power switch, which may be performed by a driver circuit according to this disclosure. FIG. 9 will be described from the perspective of driver circuit 102 shown in FIG. 1, although the method could apply to wide variety other driver circuits. As shown in FIG. 9, driver circuit 102 delivers drive signals from output pin 114 to a power switch within power switch circuit 104 in order to control ON/OFF switching of the power switch (901). Driver circuit 102 receives a signal associated with the power switch via a detection pin 116 (902). For example, detection pin 116 may comprise an already-existing DESAT detection pin or an already existing OCP pin. Based on the signal on detection pin 116, driver circuit 102 detects whether the power switch is in a desaturation mode or an overcurrent state (903). If the power switch is in a desaturation mode or overcurrent state (yes branch of 903), driver circuit 102 disables the power switch (905). Even if the power switch is NOT in a desaturation mode or overcurrent state (no branch of 903), driver circuit 102 performs additional checks regarding the SOA. In particular, driver circuit 102 detects whether the power switch is trending towards an SOA limit of the power switch (904). If the power switch is trending towards the SOA limit of the power switch (yes branch of 904), driver circuit 102 disables the power switch (906).

As explained above, the detection pin may comprise an already-existing DESAT detection pin, in which case detecting whether the power switch is in the desaturation mode (903) may include comparing a signal magnitude of the signal on the DESAT detection pin to a desaturation threshold when the power switch is ON.

Moreover, as described above, detecting whether the power switch is trending towards the SOA limit (904) may comprise determining a rate of change of the signal on the DESAT detection pin based on two or more measurements of an accumulation of the signal, wherein the signal indicates a voltage drop across the power switch and the two or more measurements of the accumulation of the signal define a slope of the accumulation over a period of time that is indicative of the rate of change of the signal. For example, two voltage measurements and the time between them may be used to define the two or more measurements of the accumulation of the signal. Ultimately, two or more measurements of an accumulation of the signal can define a slope or slew rate associated with the voltage over the power switch, which can be identified as acceptable or as requiring the switch to be disabled due to the likelihood of a future SOA violation.

As noted, in some cases, driver circuit 102 may account for temperature in the power switch, e.g., detecting whether the power switch is trending towards the SOA limit of the power switch based on the rate of change of the signal and based on a temperature associated with the power switch. In some cases, the rate of change of the signal on detection pin 116 is determined over a period of time, wherein upon turning the power switch ON, the period of time begins after a blanking period or after current through the power switch reaches a current threshold. Driver circuit 102 may be configured to determine the rate of change after the blanking period or after the current through the power switch reaches a current threshold, which may allow driver circuit 102 to ignore voltage or current spikes that are typical at the beginning of a switching cycle when turning the power transistor ON.

As additional alternatives to the techniques and circuits described above, in some examples, the SOA protection techniques of this disclosure could be implemented on a separate pin of the driver circuit (e.g., separate from the DESAT or OCP pin. Also, an analog-to-digital converter (or other circuitry) could be used to measure the DESAT voltage on the DESAT pin. In still other examples, an RC circuit could be used by the driver circuit to integrate the voltage on the DESAT pin, and this integration could be used to determine whether the power switch is trending towards the SOA limit. Also, the driver circuit could use a fast-current detection, e.g., via magnetic principle (Hall) or indirect current principle (Shunt) in order to monitor the current level through of the power switch.

The discussion of FIGS. 1-9 above has generally involved a discussion of predictive monitoring of SOA via an already existing detection pin that is also used for other reasons, e.g., DESAT or OCP. The described SOA monitoring is typically performed when a power transistor is turned ON, sometimes after a period of time being ON or after the current through the power transistor has reached a current threshold while being ON.

There are also other situations, however, when problems can occur to a power switch when the power switch is turned OFF. For example, there are situations where a short in an inductive load can cause damage to a power switch by overwhelming a so-called body diode of the power switch when the power switch is turned off. Furthermore, there are other situations where the body diode can be overwhelmed when the power switch is turned off. Some power switches, such as MOSFETs, include a body diode. The body diode may comprise a parasitic PN junction that is formed in fabricating power switch.

In some examples of this disclosure, a driver circuit may use an already-existing detection pin in order to monitor whether a body diode needs protection when the power switch is turned OFF. Such body diode protection of the power switch may be desirable in order to protect the switch from damage that can occur due to current or voltage passing to the switch from an inductive load when the power switch is turned OFF. Accordingly, in this case, the detection pin may be used by the driver circuit to monitor whether body diode of the power switch needs protection, and if so, the driver circuit may control the power switch in a way that can protect the body diode.

Figure 10:
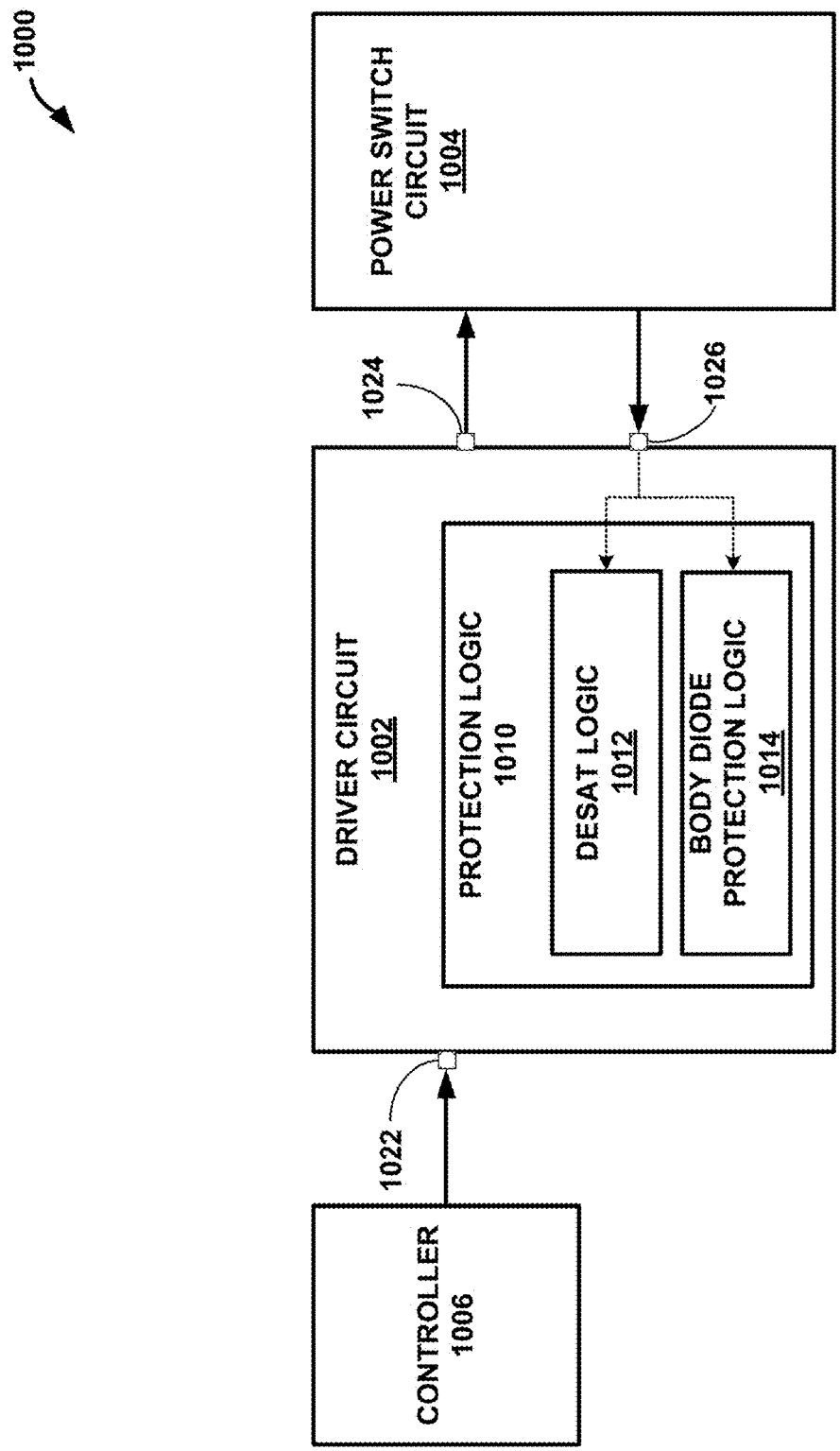
FIG. 10 is a block diagram of an example system that includes a power switch circuit, a driver circuit, and a controller.

FIG. 10 is a block diagram of an example system 1000 that includes a power switch circuit 1004, a driver circuit 1002, and a controller 1006. Controller 1006 may comprise a microprocessor configured to control driver circuit 1002. Controller 1006 sends command signals to driver circuit 1002 via input pin 1022. Based on these command signals, driver circuit 1002 sends ON/OFF signals (e.g., gate control signals) to power switch circuit 1004 to turn the power switch ON or OFF.

For example, driver circuit 1002 may control power switch circuit 1004 via modulation signals on output pin 1024, which may control the ON/OFF switching of a transistor within power switch circuit 1004. The modulation signals, for example, may comprise PWM signals, PFM signals, pulse duration modulation signals, pulse density modulation signal, or another type of modulation control signal use to control a power transistor. In normal operation, the signals from driver circuit 1002 over output pin 1024 can be applied to the gate (or other control terminal) of a power switch within power switch circuit 1004 so as to control on/off switching of the power switch, and thereby control the average amount of power delivered through the power switch to a load (not shown in FIG. 10). In the most general sense, driver circuit 1002 may comprise any type of driver for any type of power switch, e.g., a high-side switch driver, a low-side switch driver, a driver within a flyback power converter, or any driver used in any circuit arrangement that controls ON/OFF switching of one or more power switches.

Power switch circuit 1004 may comprise a power transistor. In the example of FIG. 10, the power transistor within power switch circuit 1004 may comprise any transistor that includes a body diode, such as a MOSFET. The MOSFET may be formed in silicon, in which case the MOSFET may be called a silicon MOSFET. Alternatively, the MOSFET may be formed in another semiconductor material, such as SiC or GaN, in which case the MOSFET may be called a SiC MOSFET or a GaN MOSFET. Any other transistor that includes a body diode may benefit from the driver techniques of this disclosure, especially when used in controlling power to an inductive load. The body diode, for example, may comprise a parasitic PN junction that is formed in fabricating the MOSFET.

According to this disclosure, driver circuit 1002 includes protection logic 1010 connected to a detection pin 1026. Detection pin 1026 may comprise a so-called DESAT pin. DESAT logic 1012 refers to logic that is configured to determine whether a power switch within power switch circuit 1004 is operating in a desaturation mode when the power switch is turned ON. DESAT logic 1012 may be configured to disable the power switch in response to detecting that the power switch within power switch circuit 1004 is operating in the desaturation mode. For example, in order to detect whether the power switch is in the desaturation mode, DESAT logic 1012 may be configured to compare a signal magnitude of the signal on detection pin 1026 to a desaturation threshold when the power switch is ON. The signal detected on detection pin 1026, for example, may comprise a measure of the voltage drop across the power switch within power switch circuit 1004.

According to this disclosure, in addition to checking on DESAT, one or more addition checks may be performed by protection logic 1010 based on the signal or signals received at detection pin 1026. In the example of FIG. 10, protection logic 1010 includes body diode protection logic 1014. Body diode protection logic 1014 may be configured to detect whether the body diode of the power switch needs protection when the power switch is turned OFF, and in response to detecting that the body diode needs protection, control the power switch according to a body diode protection scheme. As described in greater detail below, the body diode protection scheme may include turning the switch back ON and possibly OFF again, and this process of turning ON and OFF may repeat in a manner that can protect the body diode from otherwise damaging conditions.

DESAT logic 1012 refers to logic that is configured to determine whether a power switch within power switch circuit 1004 is operating in a desaturation mode or an overcurrent state (e.g., typically one or the other). DESAT/ logic 1012 may be configured to disable the power switch in response to detecting that the power switch within power switch circuit 1004 is operating in the desaturation mode or in the overcurrent state. In the example of desaturation, in order to detect whether the power switch is in the desaturation mode, DESAT logic 1012 may be configured to compare a signal magnitude of the signal on detection pin 1026 to a desaturation threshold when the power switch is ON. The signal detected on detection pin 1026, for example, may comprise a measure of the voltage drop across the power switch within power switch circuit 1004. In some cases, this voltage drop across the power switch within power switch circuit 1004 may be referred to as a "Vce" voltage, which typically indicates a voltage between a collector and an emitter of an IGBT.

In order to detect whether the body diode of the power switch within power switch circuit 1004 needs protection, body diode protection logic 1014 is configured to compare the signal on detection pin 1026 to a negative voltage threshold when the power switch is turned OFF. If body diode protection logic 1014 determines that the signal on detection pin 1026 is lower than the negative threshold the power switch is turned OFF, body diode protection logic 1014 may be configured to turn the power switch ON according to a diode protection scheme.

The negative voltage threshold may comprise a programmable threshold in the driver circuit that can be changed to configure the driver circuit for different loads. Driver circuit 1002 may be programmed with default body diode protection thresholds, but these may be configured or reconfigured by the user. In some examples, the negative voltage threshold is a first threshold. In this case, to control the power switch according to the body diode protection scheme, body diode protection logic 1014 may be further configured to compare the signal on detection pin 1026 to a second threshold, and in response to the signal being higher than the second threshold, driver circuit 1002 may be configured to turn the power switch back OFF as part of the body diode protection scheme. Again, the body diode protection scheme may include a process of turning the power switch ON and OFF, and this process may repeat in a manner that can protect the body diode from otherwise damaging conditions. Both the first and second thresholds may comprise programmable thresholds in the driver circuit that can be changed to configure the driver circuit for different loads. The second threshold may comprise a second negative threshold or possibly a ground voltage.

The body diode protection process may begin after a blanking period, in order to allow for voltage or current spikes during a switching cycle to be ignored. The blanking period may comprise a fixed period of time or may comprise an amount of time before current through the power switch is reduced to some current threshold. Accordingly, in some examples, upon driver circuit 1002 turning the power switch within power switch circuit 1004 to OFF, the body diode protection logic 1014 of driver circuit 1002 may be to detect whether the body diode of the power switch needs protection after a blanking period.

In many circuit applications, power switches (also called power transistors or power modules) are commonly used to switch currents in the range of several hundred amperes. In case of a failure in the main inverter, the system needs to switch to a safe state. For electric vehicles, for example, this failure protection is needed to passengers of the vehicle.

In an induction machine (e.g., an asychrononous motor or ASM), in an external excited motor (EESM), or in a permanent magnet synchronous machine (PMSM) without active short circuit capabilities, the safe state of the system may be to open the power switches so that the energy, which can be stored in the windings or cage of the machine, will not cause any torque on the wheels. The disadvantage of this safe state is that the current cannot be controlled, and in some cases, the current can reach current peaks above thousands of Amps flowing through the reverse body diode of the power semiconductor. Such situations can possibly damage or destroy the power switch.

Possible solutions to this problem may include:
  Limitations that SiC/GaN MOSFETs cannot be used with an ASM or an EESM or a PMSM without active short circuit capabilities
  Limitations that the power MOSFET needs to be overbuilt to have enough die size and thermal capacity to withstand the high upcoming currents through its body diode
  Limitations that the power MOSFET may need to have an additional diode in parallel with its body diode to split the upcoming currents through its body diode
  Limitations that require voltage monitoring of current over the body diode with external components, which in the case of fly-back power converter, may need to be transferred back to a microcontroller which may be a galvanically isolated "primary side" controller that galvanically isolated from a secondary-side power switch."

All of these potential solutions, however, have very high cost and/or complexities associated with the solutions.

The body diode protection scheme of this disclosure, which may be performed on an existing detection pin when the power switch is turned OFF, may provide a better solution that those mentioned above. For some situations, the techniques of this disclosure may allow for SiC power modules to be used with ASMs, EESMs, or a PMSM without active short circuit capabilities.

The techniques of this disclosure may solve one or more problems outlined above, by monitoring the forward voltage of the (reverse) body diode of a power semiconductor with its gate driver. If a high current is flowing through the body diode the power switch can be turned ON to take over the current. Due to its low Rds_ON, less energy may be absorbed in the power module. By leveraging an already existing pin that is under-ground capable, such as an existing DESAT pin, no extra cost will be generated, and implementation may be highly compatible to existing gate drivers.

Figure 11:
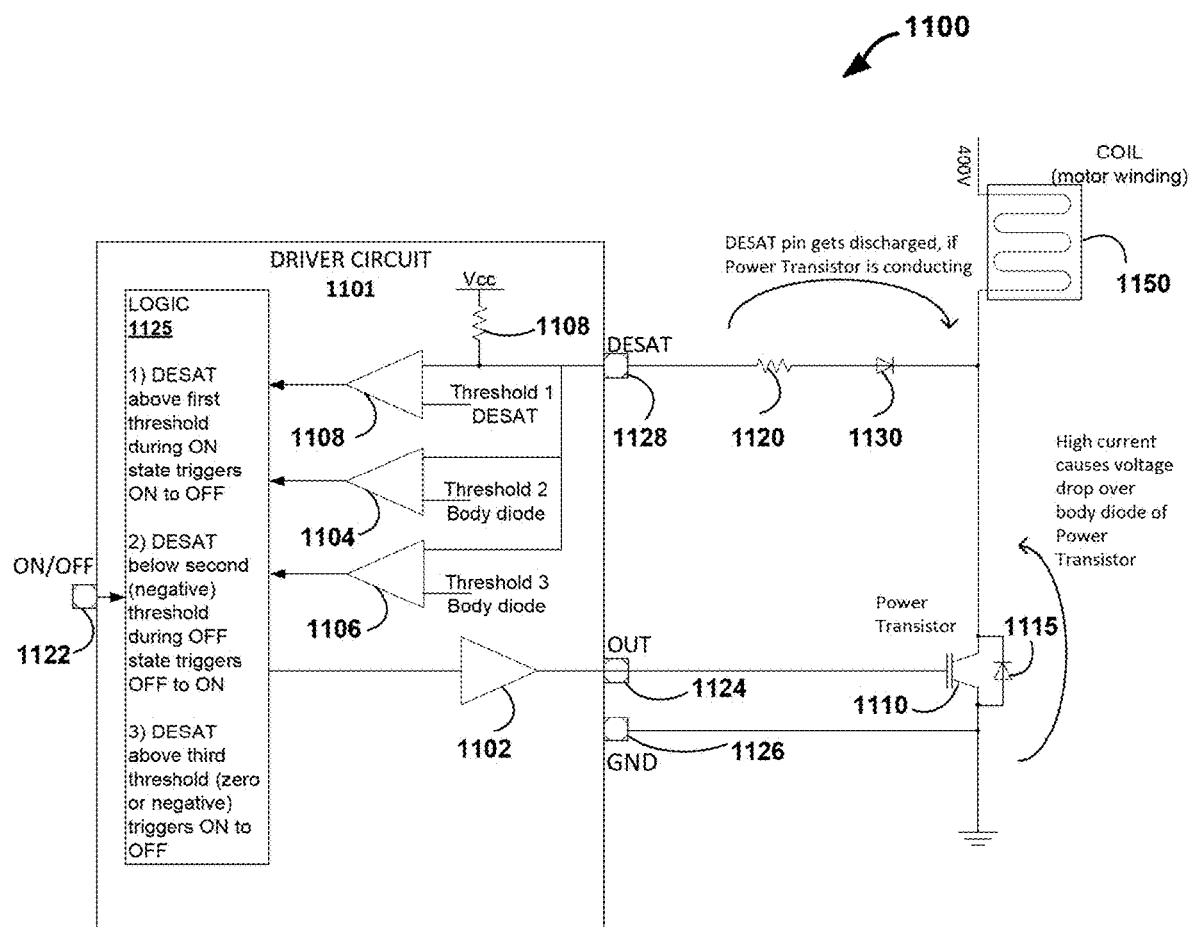
FIG. 11 is a block diagram of an example gate driver circuit controlling a power transistor that is connected to an inductive load.

FIG. 11 is a block diagram of an example gate driver circuit 1101 controlling a power transistor 1110 that is connected to an inductive load 1150. In this example, power transistor 1110 may comprise any power transistor that includes a body diode 1115, such as a MOSFET. Body diode 1115 comprise a parasitic PN junction that is formed in fabricating the power transistor 1110. Driver circuit 1101 may comprise a gate driver that receives ON/OFF command signals via input pin 1122, which may be connected to a microprocessor. Based on these ON/OFF command signals, driver circuit 1101 sends ON/OFF signals to the gate of power transistor 1110 via output pin 1124. One or more amplifiers 1102 may generate the gate driving signals based on the ON/OFF command signals received at input pin 1122. The gate driving signals, for example, may comprise PWM signals, PFM signals, pulse duration modulation signals, pulse density modulation signal, or another type of modulation control signal use to control power transistor 1110. In normal operation, the signals from driver circuit 1101 over output pin 1124 are applied to the gate (or other control terminal) of power transistor 1110 so as to control on/off switching of power transistor 1110, and thereby control the average amount of power delivered through the power switch to inductive load 1150. A ground pin 1126 is also illustrated in FIG. 11.

According to this disclosure, driver circuit 1101 includes logic 1125 that is connected to a DESAT pin 1128. Although illustrated separately, logic 1125 may include comparators 1108, 1104, and 1106, as well as resistor 1108 between a reference Vcc voltage and DESAT pin 1128. Externally to driver circuit 1101, DESAT pin 1128 may be connected to resistor 1120. Resistor 1120 is connected to diode 1130, and diode 1130 is connected to the load current path between load 1150 and power transistor 1110. Put another way, resistor 1120 and diode 1130 are positioned between DESAT pin 1128 and a node located between power transistor 1110 and inductive load 1150. This arrangement allows driver circuit 1101 to use DESAT pin 1128 and external diode 1130 to monitor a negative voltage across power transistor 1110 when power transistor 1110 is turned off.

External diode 1120 may comprise a voltage decoupling device for driver circuit 1101. In particular, external diode 1120 decouples the high voltage domain associated with the load current path of power transistor 1110 from the low voltage domain of driver circuit 1101. Driver circuit 1101, for example may operate at less than 50 or 60 volts, whereas the load current path of power transistor 1110 may be capable of withstanding voltages above 1000 volts.

When power transistor 1110 is turned ON, driver circuit 1101 may be configured to disable power transistor 1110 in response to detecting that power transistor 1110 is operating in a desaturation mode. For example, comparator 1108 may be configured to compare a signal magnitude of the signal on DESAT pin 1128 to a desaturation threshold when the power switch is ON. Again, the signal detected on DESAT pin 1128 may comprise a measure of the voltage drop across power transistor 1110. If the signal detected on DESAT pin 1128 exceeds the DESAT threshold (as determined by comparator 1108), then logic 1125 may cause driver circuit 1101 to send output signals over output pin 1128 that disable power transistor 1110. The DESAT threshold may be approximately 9 volts, for example, although different transistors may define higher or lower DESAT thresholds.

According to this disclosure, in addition to checking on desaturation of power transistor 1110 when power transistor 1110 is turned ON, driver circuit 1101 may be further configured to perform one or more addition checks based on the signal or signals received at DESAT pin 1128 when power transistor 1110 is turned OFF. In particular, driver circuit 1101 includes additional comparators 1104 and 1106, as well as additional logic within logic 1125 that is configured to detect whether body diode 1115 of power transistor 1110 needs protection. Although illustrated separately, additional comparators 1104 and 1106 may be considered part of logic 1125 within driver circuit 1101.

Driver circuit 1101 may be configured to detect whether body diode 1115 of power transistor 1110 needs protection when power transistor 1110 is turned OFF, and in response to detecting that body diode 1115 needs protection, driver circuit 1101 may be configured to control power switch 1110 according to a body diode protection scheme. For example, comparator 1104 may be configured to detect whether body diode 1115 needs protection by comparing the signal on DESAT pin 1128 to a negative voltage threshold. In this case, if the voltage on DESAT pin 1128 is lower negative voltage threshold (i.e., has a higher negative voltage magnitude than the negative voltage threshold), the driver circuit 1101 may be configured to control power switch according to the body diode protection scheme. For the body diode protection, logic 1125 may be configured to turn the power switch ON in response comparator 1104 detecting the signal on DESAT pin 1128 being lower than the negative threshold. The negative threshold of comparator 1104 may comprise a programmable threshold that can be changed to configure driver circuit 1101 for different loads.

In some example, the negative voltage threshold (e.g., threshold 2) of comparator 1104 may comprise a first threshold associated with body diode protection. Upon turning power switch 1110 ON for the diode protection scheme, comparator 1106 may be further configured to compare the signal on DESAT pin to a second threshold (e.g., threshold 3), and in response to the signal on DESAT pin being higher in voltage than the second threshold, driver circuit 1101 may turn the power switch back OFF. Both the first threshold (e.g., threshold 2 of FIG. 11) and the second threshold (e.g., threshold 3 of FIG. 11) may comprise programmable thresholds in the driver circuit that can be changed to configure the body diode protection of driver circuit 1101 for different loads or for different transistors. The second threshold (e.g., threshold 3 of FIG. 11) may comprise either a second negative threshold or a ground. Also, in some cases, upon turning the power switch OFF, driver circuit 1101 may be configured to detect whether the body diode of the power switch needs protection after a blanking period, which can account for brief voltage or current spikes that can be ignored.

In operation, comparators 1104 and 1106 may define a voltage band for the body diode protection scheme. The body diode protection scheme may include turning the switch ON (e.g., in response to negative voltage below the negative voltage threshold 2 of comparator 1104), and then turning the switch back OFF again (e.g., in response to voltage being above threshold 3 of comparator 1106). This body diode protection process of turning ON and OFF may repeat in a manner that can protect the body diode from otherwise damaging conditions otherwise caused by a short in inductive load 1150.

In some examples, this disclosure uses a DESAT pin (e.g. 1128) an external diode (e.g., 1130) to monitor the voltage across a power transistor (e.g., 1110). According to this disclosure, in addition to DESAT monitoring, a driver circuit can be configured to monitor another two voltage levels which are below ground (or possibly at ground for the second voltage level) to detect the forward voltage of the body diode within the power semiconductor. Both of these body diode protection thresholds can be made programmable. For these threshold levels another (optionally programmable) blanking time can be added to any existing blanking times. Unlike typical DESAT monitoring, the body diode voltage monitoring may include one or more voltage levels evaluated when the power transistor is turned OFF. Once a first threshold level (e.g. threshold 2 of FIG. 11) below ground is exceeded, power transistor 1110 may be turned ON as long as the voltage on DESAT pin 1128 is above the second threshold limit (e.g., threshold 3 of FIG. 11), which may be another negative voltage level or ground.

During body diode protection, once the voltage drops below the second threshold limit (e.g., threshold 3 of FIG. 11), power transistor 1110 is turned OFF by driver circuit 1101. Although two comparators 1104 and 1106 are shown for the body diode protection scheme, in other examples, a similar scheme can be achieved with one comparator and with programmable hysteresis.

Also, temperature dependency of the forward voltage drop over body diode 1115 can be taken into account. In this case driver circuit 1101 may have one or more addition connections (not shown) to allow determination of the temperature associated with body diode 1115.

In some examples, the driver circuits of this disclosure may add one or more additional comparators on the DESAT pin with a threshold voltage below 0V (programmable or fixed levels). The body diode protection techniques may provide additional blanking time (e.g., after a Turn OFF and prior to the detection) in order to neglect false triggering, and the additional blanking time may be programmable or fixed. The error reaction for body diode protection is initially to turn the power switch ON, which is the opposite of DESAT detection, which is performed with the switch is ON and includes error reaction to turn the switch OFF when the DESAT threshold is exceed. The body diode protection scheme may hold the power switch in ON state as long as the voltage on the DESAT pin remains below a second body diode threshold (e.g., threshold 3 of FIG. 11), which may have a value below zero volts or a value of zero volts corresponding to ground.

In some examples, the described body diode protection techniques may minimize power losses in achieving a safe state. With body diode protection, in some applications, power switches can get smaller and therefore the system can become cheaper than systems that operate with driver circuits that do not perform body diode protection. The robustness of the system can be improved, and a system or circuit using the techniques of this disclosure may facilitate the ability to use SiC or GaN technologies with inductive loads, such as inductive machines, electric motors, or any other loads that are at least partially inductive.

This techniques of this disclosure may also help to achieve a market of SiC MOSFETs to ASM, EESM or PMSM without active short circuit capabilities for main inverter applications. Moreover, in some examples, the techniques may allow the operational specifications of power MOSFETS and the body diodes to be significantly decreased relative systems or circuits that do not use the techniques of this disclosure.

Figure 12:
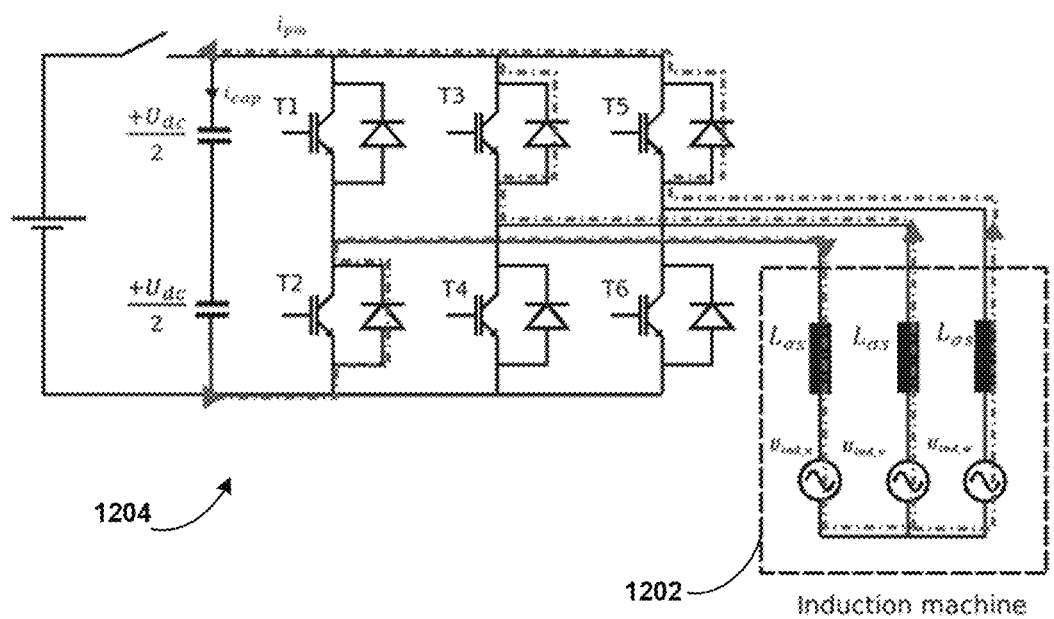
FIG. 12 is a circuit diagram showing an induction machine (e.g., a three-phase electric motor) that is controlled by a set of power switches.

FIG. 12 is a circuit diagram showing an induction machine 1202 (e.g., a three-phase electric motor) that is controlled by a set of power switches 1204. FIG. 12 shows a possible current flow path if induction machine 1202 includes an electrical short. In this case current is able to flow through the body diodes or power switches T3 and T5, which may cause problems or damage to power switches T3 and T5. The techniques of this disclosure may help protect power switches for these or other situations where uncontrolled current can flow through the body diodes.

Figure 13:
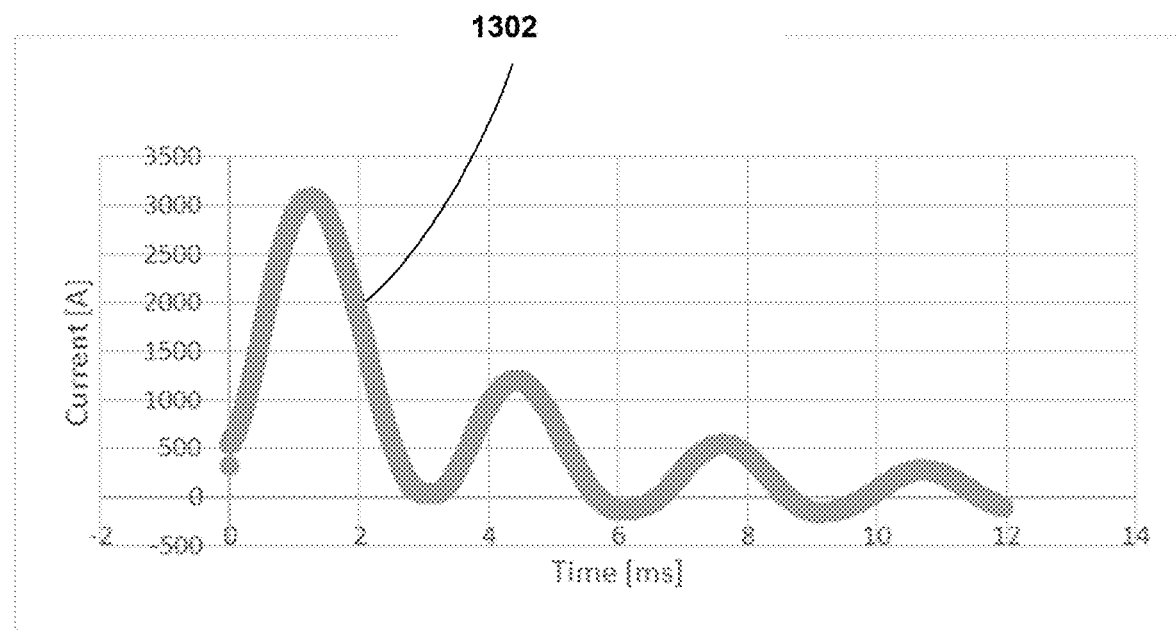
FIG. 13 is a graph illustrating current over time that can be caused by free-wheeling motion of an electric motor.

FIG. 13 is a graph illustrating current over time that can be caused by free-wheeling motion of an electric motor. The current spikes shown in curve 1302 dampen over time, but these current spikes can cause damage. In some examples, the body diode protection scheme of this disclosure, which is implemented on an already existing DESAT pin, can protect the body diode of power switches from current spikes like those shown in FIG. 13.

Figure 14:
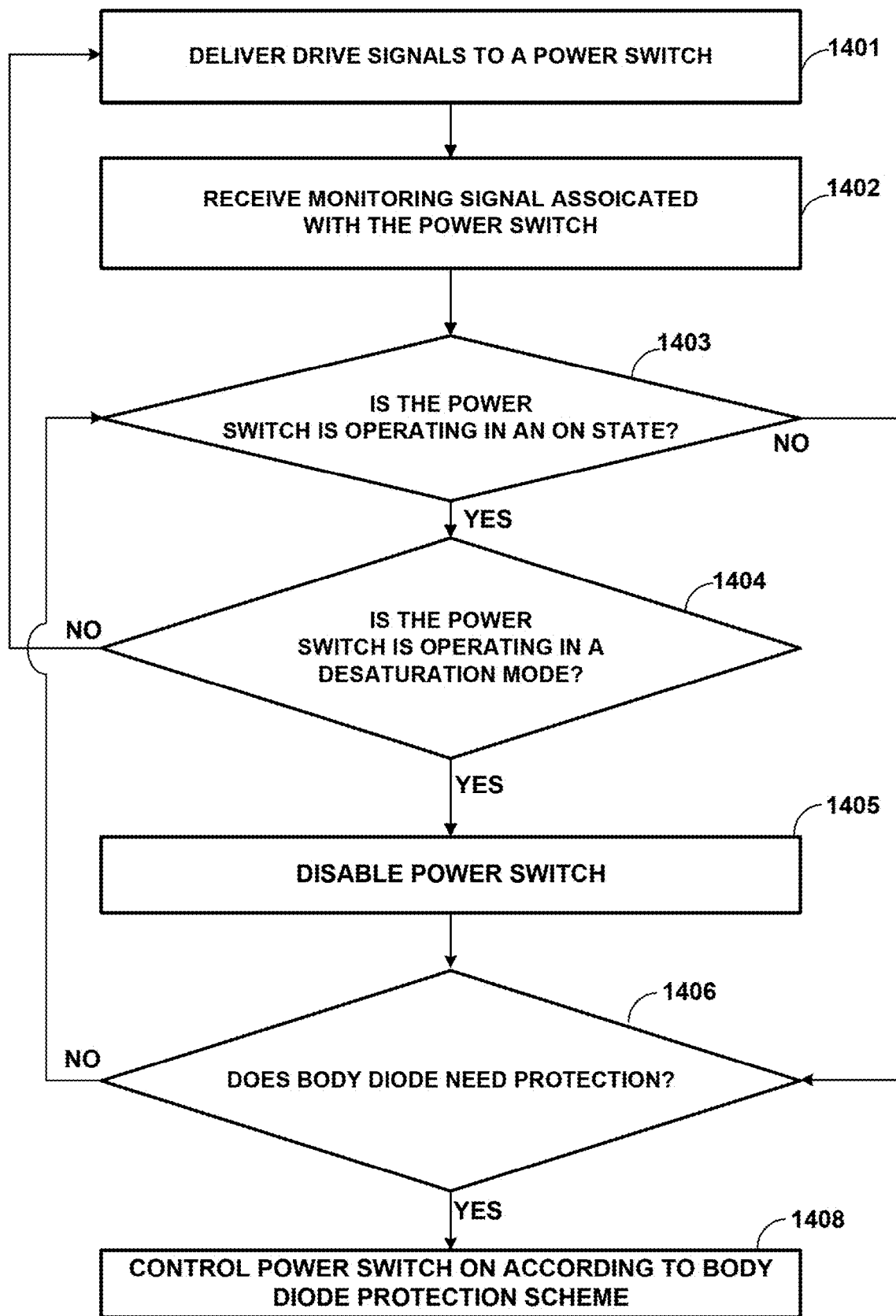
FIG. 14 is a flow diagram illustrating a method of controlling a power switch, which may be performed by a driver circuit according to this disclosure.

FIG. 14 is a flow diagram illustrating a method of controlling a power switch, which may be performed by a driver circuit according to this disclosure. FIG. 14 will be described from the perspective of driver circuit 1002 shown in FIG. 10, although the method could apply to wide variety other driver circuits. As shown in FIG. 14, driver circuit 1102 delivers drive signals from output pin 1124 to a power switch within power switch circuit 1004 in order to control ON/OFF switching of the power switch (1401). Driver circuit 1102 receives a signal associated with the power switch via a detection pin 1026 (1402). For example, detection pin 1102 may comprise an already-existing DESAT detection pin. When the power switch is operating in an ON state (yes branch of 1403), based on the signal on detection pin 1102, driver circuit 1002 detects whether the power switch is in a desaturation mode (1404). If the power switch is in a desaturation mode (yes branch of 1404), driver circuit 1002 disables the power switch (1405).

According to this disclosure, driver circuit 1002 is configured to perform additional checks when the power switch is operating in an OFF state (no branch of 1403). In particular, when the power switch within power switch circuit 104 is turned OFF (no branch of 1403), driver circuit 1002 detects whether the body diode of the power switch needs protection based on the signal on detection pin 1026. Based on the signal detection pin 1026, if the body diode of the power switch needs protection (yes branch of 1406), then driver circuit 1002 controls the power switch within power switch circuit 1004 according to a body diode protection scheme (1408).

As explained above, the detection pin may comprise an already-existing DESAT detection pin, in which case detecting whether the power switch is in the desaturation mode (1404) may include comparing a signal magnitude of the signal on the DESAT detection pin to a desaturation threshold when the power switch is ON.

Detecting whether the body diode of the power switch needs protection (1406) may include comparing the signal on a DESAT detection pin to a negative voltage threshold, and controlling the power switch according to the body diode protection scheme (1407) may comprise turning the power switch ON in response to the signal being lower than the negative threshold. In some examples, the negative threshold may be a programmable threshold in driver circuit 1402, which can be programmed or changed within driver circuit 1402 to configure driver circuit 1402 for different loads or different transistors. In some examples, the negative voltage threshold is a first threshold, and controlling the power switch according to the body diode protection scheme (1408) further comprises comparing the signal on the DESAT detection pin to a second threshold and turning the power switch back OFF in response to the signal being higher than the second threshold. In some cases, both the first and second thresholds are programmable thresholds in the driver circuit that can be changed to configure the driver circuit for different loads or for different transistors. The second threshold may be either a second negative threshold or a ground voltage. A blanking period may also be added or adjusted for body diode protection monitoring after a blanking period, upon turning the power switch OFF.

The circuits and techniques of this disclosure can provide protection against power switch malfunction, which may be desirable in a wide variety of circuit applications, especially in settings where safety is a concern. There are many different circuits and techniques described herein, and these different techniques may be related to specific solutions for protecting the power switch when the power switch is turned ON or for protecting the power switch when the power switch is turned OFF.

The techniques of this disclosure may leverage an already-existing detection pin associated with a driver circuit. The detection pin, for example, may comprise a so-called DESAT pin, or possibly an OCP pin. For example, FIGS. 1-10 describe various circuits and techniques in which an already-existing detection pin may be used to monitor an SOA limit of the power switch when the switch is operating in an ON state. In addition, FIGS. 11-14 describe various circuits and techniques in which an already-existing detection pin may be used to monitor whether a body diode needs protection when the power switch is turned OFF. In some examples, the techniques and circuits described in FIGS. 11-14 can be combined with the techniques and circuits described in FIGS. 1-10. In other words, a driver circuit may be configured with advanced detection capabilities on an existing DESAT pin that can perform DESAT detection, perform SOA monitoring, and perform body diode protection, via single detection pin. In this case, the driver circuit may include logic similar to that of FIGS. 1 and 10, and the driver circuit may perform the methods of FIG. 9 and FIG. 14.

Figure 15:
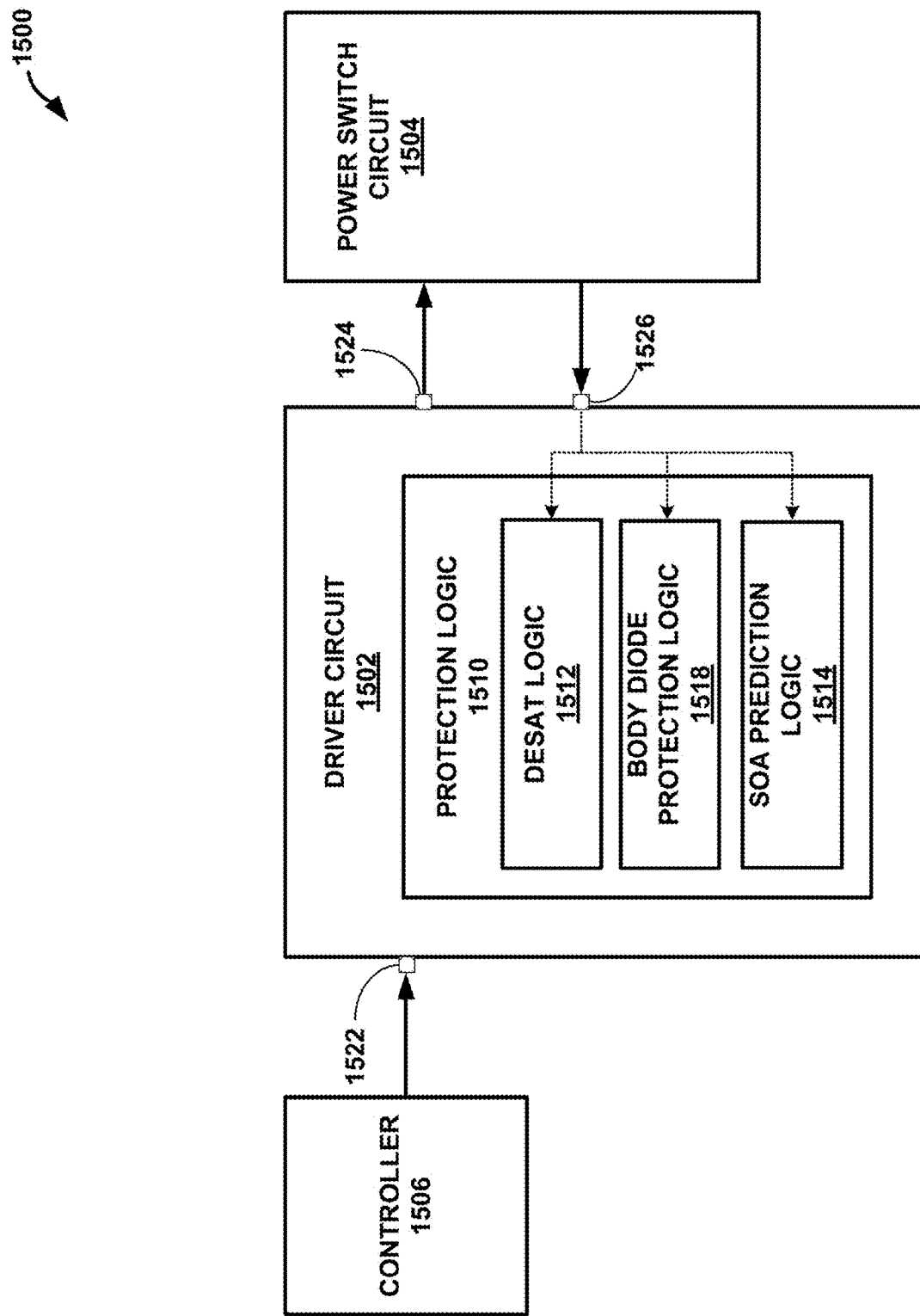
FIG. 15 is a block diagram of an example system that includes a power switch circuit, a driver circuit, and a controller.

FIG. 15 is a block diagram of an example system 1500 that includes a power switch circuit 1504, a driver circuit 1502, and a controller 1506. Controller 1506 may comprise a microprocessor configured to control driver circuit 1502. Controller 1506 sends command signals to driver circuit 1502 via input pin 1522. Based on these command signals, driver circuit 1502 sends ON/OFF signals (e.g., gate control signals) to power switch circuit 1504 to turn the power switch ON or OFF.

Driver circuit 1502 may control power switch circuit 1504 via modulation signals on output pin 1524, which may control the ON/OFF switching of a transistor within power switch circuit 1504. The modulation signals, for example, may comprise PWM signals, PFM signals, pulse duration modulation signals, pulse density modulation signal, or another type of modulation control signal use to control a power transistor. In normal operation, the signals from driver circuit 1502 over output pin 1524 can be applied to the gate (or other control terminal) of a power switch within power switch circuit 1504 so as to control on/off switching of the power switch, and thereby control the average amount of power delivered through the power switch to a load (not shown in FIG. 15). Driver circuit 1502 may comprise any type of driver for any type of power switch, e.g., a high-side switch driver, a low-side switch driver, a driver within a flyback power converter, or any driver used in any circuit arrangement that controls ON/OFF switching of one or more power switches.

Power switch circuit 1504 may comprise a power transistor. In the example of FIG. 15, the power transistor within power switch circuit 1504 may comprise any transistor that includes a body diode, such as a MOSFET. The MOSFET may be formed in silicon, in which case the MOSFET may be called a silicon MOSFET. Alternatively, the MOSFET may be formed in another semiconductor material, such as SiC or GaN, in which case the MOSFET may be called a SiC MOSFET or a GaN MOSFET. Any other transistor that includes a body diode may benefit from the driver techniques of this disclosure, especially when used in controlling power to an inductive load. The body diode, for example, may comprise a parasitic PN junction that is formed in fabricating the MOSFET.

According to this disclosure, driver circuit 1502 includes protection logic 1510 connected to a detection pin 1526. Detection pin 1526 may comprise a so-called DESAT pin. DESAT logic 1512 refers to logic that is configured to determine whether a power switch within power switch circuit 1504 is operating in a desaturation mode when the power switch is turned ON. DESAT logic 1512 may be configured to disable the power switch in response to detecting that the power switch within power switch circuit 1504 is operating in the desaturation mode. For example, in order to detect whether the power switch is in the desaturation mode, DESAT logic 1512 may be configured to compare a signal magnitude of the signal on detection pin 1526 to a desaturation threshold when the power switch is ON. The signal detected on detection pin 1526, for example, may comprise a measure of the voltage drop across the power switch within power switch circuit 1504.

In addition to checking on DESAT, additional checks may be performed by protection logic 1510 based on the signal or signals received at detection pin 1526. In the example of FIG. 15, protection logic 1510 includes body diode protection logic 1518. Body diode protection logic 1518 may be configured to detect whether the body diode of the power switch needs protection when the power switch is turned OFF, and in response to detecting that the body diode needs protection, control the power switch according to a body diode protection scheme. Additional details of body diode protection schemes in greater detail above in the discussion of FIGS. 11-14, and these or other body diode protection schemes may be performed by body diode protection logic 1518 in response to detecting that the body diode needs protection when the power switch is turned OFF.

Also, with the example of FIG. 15, in addition to checking on DESAT and checking whether the body diode needs protection, protection logic 1510 may also include SOA protection logic 1514, which may be similar to SOA protection logic 14 described in FIG. 1. Thus, with the example of FIG. 15, a driver circuit 1502 may be configured to detect whether the power switch is in a desaturation mode when the power switch is turned ON; disable the power switch in response to detecting that the power switch is in the desaturation mode; detect whether the body diode of the power switch needs protection when the power switch is turned OFF; in response to detecting that the body diode needs protection, control the power switch according to a body diode protection scheme; detect whether the power switch is trending towards an SOA limit of the power switch based on a rate of change of the signal when the power switch is turned ON; and disable the power switch in response to detecting that the power switch is trending towards the SOA limit. In some examples, driver circuit 1510 may be configured to perform the methods of both FIG. 9 and FIG. 14.

The following clauses may illustrate one or more aspects of the disclosure.

Clause 1—A driver circuit configured to control a power switch, the driver circuit comprising: an output pin, wherein the driver circuit is configured to deliver drive signals from the output pin to the power switch to control ON/OFF switching of the power switch; a detection pin configured to receive a signal associated with the power switch, wherein the detection pin comprises a DESAT detection pin or an OCP pin; and protection logic connected to the detection pin, wherein the protection logic is configured to: detect whether the power switch is in a desaturation mode or an overcurrent state based on the signal; disable the power switch in response to detecting that the power switch is in the desaturation mode or the overcurrent state; detect whether the power switch is trending towards a SOA limit of the power switch based on a rate of change of the signal; and disable the power switch in response to detecting that the power switch is trending towards the SOA limit.

Clause 2—The driver circuit of clause 1, wherein the detection pin comprises the DESAT detection pin and the protection logic is configured to detect whether the power switch is in the desaturation mode and disable the power switch in response to detecting that the power switch is in the desaturation mode, wherein to detect whether the power switch is in the desaturation mode, the protection logic is configured to compare a signal magnitude of the signal to a desaturation threshold when the power switch is ON.

Clause 3—The driver circuit of clause 1 or 2, wherein to detect whether the power switch is trending towards the SOA limit, the protection logic is configured to determine the rate of change of the signal based on two or more measurements of an accumulation of the signal.

Clause 4—The driver of clause 3, wherein the signal indicates a voltage drop across the power switch and the two or more measurements of the accumulation of the signal define a slope of the accumulation over a period of time that is indicative of the rate of change of the signal.

Clause 5—The driver circuit of any of clauses 1-4, wherein the power switch comprises: an IGBT; a silicon MOSFET; a SiC MOSFET; or a GaN MOSFET.

Clause 6—The driver circuit of any of clauses 1-5, wherein the protection logic is configured to detect whether the power switch is trending towards the SOA limit of the power switch based on the rate of change of the signal and based on a temperature associated with the power switch.

Clause 7—The driver circuit of any of clauses 1-6, wherein the rate of change is determined over a period of time, wherein upon turning the power switch ON, the period of time begins after a blanking period or after current through the power switch reaches a current threshold.

Clause 8—The driver circuit of any of clauses 1-7, wherein the rate of change corresponds to a slew rate.

Clause 9—The driver circuit of clause 8, wherein the protection logic is configured to determine the slew rate based on an amount of time between an accumulation of the signal reaching a first threshold and the accumulation of the signal reaching a second threshold.

Clause 10—The driver circuit of clause 9, wherein upon turning the power switch ON, the amount of time occurs after a blanking period or after current through the power switch reaches a current threshold.

Clause 11—A method of controlling a power switch, the method comprising: delivering drive signals from an output pin to the power switch to control ON/OFF switching of the power switch; receiving a signal associated with the power switch via a detection pin, wherein the detection pin comprises a DESAT detection pin or an OCP pin; detecting whether the power switch is in a desaturation mode or an overcurrent state based on the signal; disabling the power switch in response to detecting that the power switch is in the desaturation mode or the overcurrent state; detecting whether the power switch is trending towards an SOA limit of the power switch; and disabling the power switch in response to detecting that the power switch is trending towards the SOA limit.

Clause 12—The method of clause 11, wherein the detection pin comprises a DESAT detection pin and the method comprises detecting whether the power switch is in the desaturation mode and disabling the power switch in response to detecting that the power switch is in the desaturation mode, wherein detecting whether the power switch is in the desaturation mode includes comparing a signal magnitude of the signal to a desaturation threshold when the power switch is ON.

Clause 13—The method of clause 11 or 12, wherein detecting whether the power switch is trending towards the SOA limit comprises determining the rate of change of the signal based on two or more measurements of an accumulation of the signal, wherein the signal indicates a voltage drop across the power switch and the two or more measurements of the accumulation of the signal define a slope of the accumulation over a period of time that is indicative of the rate of change of the signal.

Clause 14—The method any of clauses 11-13, further comprising detecting whether the power switch is trending towards the SOA limit of the power switch based on the rate of change of the signal and based on a temperature associated with the power switch.

Clause 15—The method of any of clauses 11-14, wherein the rate of change is determined over a period of time, wherein upon turning the power switch ON, the period of time begins after a blanking period or after current through the power switch reaches a current threshold.

Clause 16—The method of any of clause 11-15, wherein the rate of change corresponds to a slew rate, wherein the method comprises: determining the slew rate based on an amount of time between an accumulation of the signal reaching a first threshold and the accumulation of the signal reaching a second threshold.

Clause 17—The method of clause 16, wherein upon turning the power switch ON, the amount of time occurs after a blanking period or after current through the power switch reaches a current threshold.

Clause 18—A system comprising: a power switch that includes a transistor; and a driver circuit configured to control the power switch, the driver circuit comprising: an output pin, wherein the driver circuit is configured to deliver drive signals from the output pin to the power switch to control ON/OFF switching of the power switch; a detection pin configured to receive a signal associated with the power switch, wherein the detection pin comprises a DESAT detection pin or an OCP pin; and protection logic connected to the detection pin, wherein the protection logic is configured to: detect whether the power switch is in a desaturation mode or an overcurrent state based on the signal; disable the power switch in response to detecting that the power switch is in the desaturation mode or the overcurrent state; detect whether the power switch is trending towards an SOA limit of the power switch based on a rate of change of the signal; and disable the power switch in response to detecting that the power switch is trending towards the SOA limit.

Clause 19—The system of clause 18, the system further comprising: a microcontroller configured to deliver control signals to the driver circuit, wherein the control signals define the drive signals.

Clause 20—The system of clause 18 or 19, further comprising: a resistor; and a diode, wherein the resistor and the diode are positioned between the detection pin and a node located between the power switch and an inductive load.

Clause 21—A driver circuit configured to control a power switch that includes a body diode, the driver circuit comprising: an output pin, wherein the driver circuit is configured to deliver drive signals from the output pin to the power switch to control ON/OFF switching of the power switch; a detection pin configured to receive a signal associated with the power switch, wherein the detection pin comprises a DESAT detection pin; and protection logic connected to the detection pin, wherein the protection logic is configured to:

detect whether the power switch is in a desaturation mode when the power switch is turned ON; disable the power switch in response to detecting that the power switch is in the desaturation mode; detect whether the body diode of the power switch needs protection when the power switch is turned OFF; and in response to detecting that the body diode needs protection, control the power switch according to a body diode protection scheme.

Clause 22—The driver circuit of clause 21, wherein to detect whether the power switch is in the desaturation mode, the protection logic is configured to compare a signal magnitude of the signal to a desaturation threshold.

Clause 23—The driver circuit of clause 21 or 22, wherein to detect whether the body diode of the power switch needs protection, the protection logic is configured to compare the signal to a negative voltage threshold, wherein to control the power switch according to the body diode protection scheme, the protection logic is configured to turn the power switch ON in response to the signal being lower than the negative threshold.

Clause 24—The driver circuit of clause 23, wherein the negative threshold is a programmable threshold in the driver circuit that can be changed to configure the driver circuit for different loads.

Clause 25—The driver circuit of clause 23 or 24, wherein the negative voltage threshold is a first threshold, wherein to control the power switch according to the body diode protection scheme, the protection logic is further configured to compare the signal to a second threshold, and in response to the signal being higher than the second threshold, turn the power switch back OFF.

Clause 26—The driver circuit of clause 25, wherein the first and second thresholds are programmable thresholds in the driver circuit that can be changed to configure the driver circuit for different loads.

Clause 27—The driver circuit of clause 25 and 26, wherein the second threshold is either a second negative threshold or a ground.

Clause 28—The driver circuit of any of clauses 21-27, wherein the power switch comprises: a silicon MOSFET; a GaN MOSFET; or a SiC MOSFET.

Clause 29—The driver circuit of any of clauses 21-28, wherein upon turning the power switch OFF, the driver circuit is configured to detect whether the body diode of the power switch needs protection after a blanking period.

Clause 30—The driver circuit of any of clauses 21-29, wherein the driver circuit is further configured to: detect whether the power switch is trending towards an SOA limit of the power switch based on a rate of change of the signal when the power switch is turned ON; and disable the power switch in response to detecting that the power switch is trending towards the SOA limit.

Clause 31—A method of controlling a power switch that includes a body diode, the method comprising: delivering drive signals from output pin of a driver circuit to the power switch to control ON/OFF switching of the power switch; receiving a signal associated with the power switch via a detection pin of the driver circuit, wherein the detection pin comprises a DESAT detection pin; detecting whether the power switch is in a desaturation mode when the power switch is turned ON; disabling the power switch in response to detecting that the power switch is in the desaturation mode; detecting whether the body diode of the power switch needs protection when the power switch is turned OFF; and in response to detecting that the body diode needs protection, control the power switch according to a body diode protection scheme.

Clause 32—The method of clause 31, wherein detecting whether the power switch is in the desaturation mode includes comparing a signal magnitude of the signal to a desaturation threshold.

Clause 33—The method of clause 31 or 32, wherein detecting whether the body diode of the power switch needs protection includes comparing the signal to a negative voltage threshold, wherein controlling the power switch according to the body diode protection scheme comprises: turning the power switch ON in response to the signal being lower than the negative threshold.

Clause 34—The method of clause 33, wherein the negative threshold is a programmable threshold in the driver circuit that can be changed to configure the driver circuit for different loads.

Clause 35—The method of clause 33 or 34, wherein the negative voltage threshold is a first threshold, wherein controlling the power switch according to the body diode protection scheme further comprises: comparing the signal to a second threshold and turning the power switch back OFF in response to the signal being higher than the second threshold.

Clause 36—The method of clause 35, wherein the first and second thresholds are programmable thresholds in the driver circuit that can be changed to configure the driver circuit for different loads.

Clause 37—The method of clause 35 or 36, wherein the second threshold is either a second negative threshold or a ground.

Clause 38—The method of any of clauses 31-37, further comprising: upon turning the power switch OFF, detecting whether the body diode of the power switch needs protection after a blanking period.

Clause 39—The method of any of clauses 31-38, further comprising: detecting whether the power switch is trending towards an SOA limit of the power switch based on a rate of change of the signal when the power switch is turned ON; and disabling the power switch in response to detecting that the power switch is trending towards the SOA limit.

Clause 40—A system comprising: a power switch that includes a transistor; and a driver circuit configured to control the power switch, the driver circuit comprising: an output pin, wherein the driver circuit is configured to deliver drive signals from the output pin to the power switch to control ON/OFF switching of the power switch; a detection pin configured to receive a signal associated with the power switch, wherein the detection pin comprises a DESAT detection pin; and protection logic connected to the detection pin, wherein the protection logic is configured to: detect whether the power switch is in a desaturation mode or when the power switch is turned ON; disable the power switch in response to detecting that the power switch is in the desaturation mode; detect whether the body diode of the power switch needs protection when the power switch is turned OFF; and in response to detecting that the body diode needs protection, turn the power switch ON and OFF according to a body diode protection scheme.

Clause 41—The system of clause 40, the system further comprising: a microcontroller configured to deliver control signals to the driver circuit, wherein the control signals define the drive signals.

Clause 42—The system of clause 40 or 41, further comprising: a resistor; and a diode, wherein the resistor and the diode are positioned between the detection pin and a node located between the power switch and an inductive load.

Clause 43—The system of any of clauses 40-42, wherein to detect whether the body diode of the power switch needs protection, the protection logic is configured to compare the signal to a first voltage threshold, wherein the first voltage threshold is a negative threshold, and wherein to control the power switch according to the body diode protection scheme, the protection logic is configured to turn the power switch ON in response to the signal being lower than the first voltage threshold, and wherein to control the power switch according to the body diode protection scheme, the protection logic is further configured to compare the signal to a second voltage threshold, and in response to the signal being higher than the second voltage threshold, turn the power switch back OFF, wherein the second voltage threshold is a second negative threshold or zero.

Clause 44—The system of any of clauses 40-43, wherein the driver circuit is further configured to: detect whether the power switch is trending towards an SOA limit of the power switch based on a rate of change of the signal when the power switch is turned ON; and disable the power switch in response to detecting that the power switch is trending towards the SOA limit.

Various aspects have been described in this disclosure. These and other aspects are within the scope of the following claims.

The invention claimed is:

1. A driver circuit configured to control a power switch that includes a body diode, the driver circuit comprising:
    an output pin, wherein the driver circuit is configured to deliver drive signals from the output pin to the power switch to control ON/OFF switching of the power switch;
    a detection pin configured to receive a signal associated with the power switch, wherein the detection pin comprises a desaturation (DESAT) detection pin; and
    protection logic connected to the detection pin, wherein the protection logic is configured to:
    detect whether the power switch is in a desaturation mode when the power switch is turned ON;
    disable the power switch in response to detecting that the power switch is in the desaturation mode;
    detect whether the body diode of the power switch needs protection when the power switch is turned OFF; and
    in response to detecting that the body diode needs protection, control the power switch according to a body diode protection scheme.

2. The driver circuit of claim 1,
    wherein to detect whether the power switch is in the desaturation mode, the protection logic is configured to compare a signal magnitude of the signal to a desaturation threshold.

3. The driver circuit of claim 1, wherein to detect whether the body diode of the power switch needs protection, the protection logic is configured to compare the signal to a negative voltage threshold, wherein to control the power switch according to the body diode protection scheme, the protection logic is configured to turn the power switch ON in response to the signal being lower than the negative threshold.

4. The driver circuit of claim 3, wherein the negative threshold is a programmable threshold in the driver circuit that can be changed to configure the driver circuit for different loads.

5. The driver circuit of claim 3, wherein the negative voltage threshold is a first threshold, wherein to control the power switch according to the body diode protection scheme, the protection logic is further configured to compare the signal to a second threshold, and in response to the signal being higher than the second threshold, turn the power switch back OFF.

6. The driver circuit of claim 5, wherein the first and second thresholds are programmable thresholds in the driver circuit that can be changed to configure the driver circuit for different loads.

7. The driver circuit of claim 5, wherein the second threshold is either a second negative threshold or a ground.

8. The driver circuit of claim 1, wherein the power switch comprises:
    a silicon metal oxide semiconductor field effect transistor (MOSFET);
    a gallium nitride (GaN) MOSFET; or
    a silicon carbide (SiC) MOSFET.

9. The driver circuit of claim 1, wherein upon turning the power switch OFF, the driver circuit is configured to detect whether the body diode of the power switch needs protection after a blanking period.

10. The driver circuit of claim 1, wherein the driver circuit is further configured to:
    detect whether the power switch is trending towards a safe operating area (SOA) limit of the power switch based on a rate of change of the signal when the power switch is turned ON; and
    disable the power switch in response to detecting that the power switch is trending towards the SOA limit.

11. A method of controlling a power switch that includes a body diode, the method comprising:
    delivering drive signals from an output pin of a driver circuit to the power switch to control ON/OFF switching of the power switch;
    receiving a signal associated with the power switch via a detection pin of the driver circuit, wherein the detection pin comprises a desaturation (DESAT) detection pin;
    detecting whether the power switch is in a desaturation mode when the power switch is turned ON;
    disabling the power switch in response to detecting that the power switch is in the desaturation mode;
    detecting whether the body diode of the power switch needs protection when the power switch is turned OFF; and
    in response to detecting that the body diode needs protection, control the power switch according to a body diode protection scheme.

12. The method of claim 11, wherein detecting whether the power switch is in the desaturation mode includes comparing a signal magnitude of the signal to a desaturation threshold.

13. The method of claim 11, wherein detecting whether the body diode of the power switch needs protection includes comparing the signal to a negative voltage threshold, wherein controlling the power switch according to the body diode protection scheme comprises:
    turning the power switch ON in response to the signal being lower than the negative threshold.

14. The method of claim 13, wherein the negative threshold is a programmable threshold in the driver circuit that can be changed to configure the driver circuit for different loads.

15. The method of claim 13, wherein the negative voltage threshold is a first threshold, wherein controlling the power switch according to the body diode protection scheme further comprises:
    comparing the signal to a second threshold and turning the power switch back OFF in response to the signal being higher than the second threshold.

16. The method of claim 15, wherein the first and second thresholds are programmable thresholds in the driver circuit that can be changed to configure the driver circuit for different loads.

17. The method of claim 15, wherein the second threshold is either a second negative threshold or a ground.

18. The method of claim 11, further comprising:
upon turning the power switch OFF, detecting whether the body diode of the power switch needs protection after a blanking period.

19. The method of claim 11, further comprising:
detecting whether the power switch is trending towards a safe operating area (SOA) limit of the power switch based on a rate of change of the signal when the power switch is turned ON; and
disabling the power switch in response to detecting that the power switch is trending towards the SOA limit.

20. A system comprising:
a power switch that includes a transistor; and
a driver circuit configured to control the power switch, the driver circuit comprising:
an output pin, wherein the driver circuit is configured to deliver drive signals from the output pin to the power switch to control ON/OFF switching of the power switch;
a detection pin configured to receive a signal associated with the power switch, wherein the detection pin comprises a desaturation (DESAT) detection pin; and
protection logic connected to the detection pin, wherein the protection logic is configured to:
detect whether the power switch is in a desaturation mode or when the power switch is turned ON;
disable the power switch in response to detecting that the power switch is in the desaturation mode;
detect whether the body diode of the power switch needs protection when the power switch is turned OFF; and
in response to detecting that the body diode needs protection, turn the power switch ON and OFF according to a body diode protection scheme.

21. The system of claim 20, the system further comprising:
a microcontroller configured to deliver control signals to the driver circuit, wherein the control signals define the drive signals.

22. The system of claim 20, further comprising:
a resistor; and
a diode, wherein the resistor and the diode are positioned between the detection pin and a node located between the power switch and an inductive load.

23. The system of claim 20, wherein to detect whether the body diode of the power switch needs protection, the protection logic is configured to compare the signal to a first voltage threshold, wherein the first voltage threshold is a negative threshold, and wherein to control the power switch according to the body diode protection scheme, the protection logic is configured to turn the power switch ON in response to the signal being lower than the first voltage threshold, and
wherein to control the power switch according to the body diode protection scheme, the protection logic is further configured to compare the signal to a second voltage threshold, and in response to the signal being higher than the second voltage threshold, turn the power switch back OFF, wherein the second voltage threshold is a second negative threshold or zero.

24. The system of claim 20, wherein the driver circuit is further configured to:
detect whether the power switch is trending towards a safe operating area (SOA) limit of the power switch based on a rate of change of the signal when the power switch is turned ON; and
disable the power switch in response to detecting that the power switch is trending towards the SOA limit.

* * * * *